United States Patent
Takamine

(10) Patent No.: US 7,116,189 B2
(45) Date of Patent: Oct. 3, 2006

(54) SURFACE ACOUSTIC WAVE DEVICE AND COMMUNICATION APPARATUS INCLUDING THE SAME

(75) Inventor: Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 539 days.

(21) Appl. No.: 10/667,062

(22) Filed: Sep. 19, 2003

(65) Prior Publication Data

US 2004/0077325 A1   Apr. 22, 2004

(30) Foreign Application Priority Data

Sep. 20, 2002   (JP)   ............................. 2002-274673
Jun. 23, 2003   (JP)   ............................. 2003-177444

(51) Int. Cl.
*H03H 9/64*   (2006.01)
*H03H 9/25*   (2006.01)

(52) U.S. Cl. .................................. 333/195; 310/313 D

(58) Field of Classification Search ................ 333/195; 310/313 D
See application file for complete search history.

(56) References Cited

U.S. PATENT DOCUMENTS

| 5,621,364 A | * | 4/1997 | Ruile et al. | ................. 333/195 |
| 6,650,207 B1 | * | 11/2003 | Tanaka | ....................... 333/195 |
| 7,015,776 B1 | * | 3/2006 | Takamine | ................... 333/195 |

FOREIGN PATENT DOCUMENTS

| JP | 10-117123 | | 5/1998 |
| JP | 2000-196399 | * | 7/2000 |

* cited by examiner

*Primary Examiner*—Barbara Summons
(74) *Attorney, Agent, or Firm*—Keating & Bennett, LLP

(57) ABSTRACT

A SAW device includes two surface-acoustic-wave filter elements arranged so as to have a balanced-to-unbalanced conversion function. The surface-acoustic-wave filter elements include two first reflectors and two second reflectors. In each surface-acoustic-wave filter element, three IDTs are arranged on a piezoelectric substrate in a direction in which surface acoustic waves are transmitted so as to be positioned between one first reflector and one second reflector. The first reflectors differ in structure from the second reflectors.

2 Claims, 24 Drawing Sheets

SURFACE ACOUSTIC WAVE DEVICE AND COMMUNICATION APPARATUS INCLUDING THE SAME

BACKGROUND OF THE INVENTION

1. Field of the Invention

The present invention relates to a surface acoustic wave (SAW) device having a balanced-to-unbalanced conversion function, and a communication apparatus including such a SAW device.

2. Description of the Related Art

There has been remarkable technological progress in the reduction in the size and weight of communication apparatuses in recent years. In order to achieve such reduction, not only are components reduced in number and size, but also combined components formed by combining functions have been developed.

With these circumstances as background, a SAW device for use in a radio frequency stage of a cellular phone having a balanced-to-unbalanced conversion function, or a so-called "balun" function, has been actively studied in recent years. Mainly, global systems for mobile communications (GSM) have come into use. Some patent applications concerning SAW devices provided with balanced-to-unbalanced conversion functions as described above have been filed.

In addition, recently developed cellular phone systems have close transmitting and receiving frequencies which have increased. With such increase, an attenuation in a receiving frequency band must be increased in a transmitting filter, and an attenuation in a transmitting frequency band must be increased in a receiving filter. Accordingly, in a SAW device, the need to increase an attenuation in the vicinity of a passband has become strong.

In a communication apparatus, it is common to use a characteristic impedance of 50 Ω in a portion from an antenna to a filter for an unbalanced signal. In many cases, in an amplifier or other component which is used after the stage of the filter, an impedance of 150 Ω to 200 Ω is used for a balanced signal.

Regarding a SAW filter device (SAW device) which also has a function of converting a 50-Ω unbalanced signal into a balanced signal having 150 Ω to 200 Ω, for example, a device in which four SAW filter elements are used to realize an unbalanced input and a balanced output is known (see, for example, Japanese Unexamined Patent Application Publication No. 10-117123). The configuration of the SAW filter device disclosed in this publication is shown in FIG. 24.

In the configuration, which is known, a spurious component in the vicinity of the passband outside of the passband is caused by excitation of surface acoustic waves. In a range in which the spurious component is generated, the phase characteristics of balanced terminals 506 and 507 are inverted as in the passband. Accordingly, a signal canceling effect in a differential state is not obtained, thus causing a problem in that the attenuation in the vicinity of the passband outside the passband is insufficient.

SAW device configurations of the related art are described below with reference to FIGS. 19 to 24.

FIG. 19 shows a SAW device 100 in which, in a configuration having the impedances of balanced signal terminals 114 and 115 which differ by approximately four times the impedance of an unbalanced signal terminal 113, an attenuation in the lower range of a passband can be increased.

As shown in FIG. 19, the SAW device 100 includes two longitudinally-coupled-resonator SAW filters (SAW filter elements) 101 and 102 on a piezoelectric substrate (not shown). The longitudinally-coupled-resonator SAW filter 101 includes three interdigital transducers (IDTs) 103, 104, and 105, and reflectors 106 and 107 on the sides of the IDTs 103 and 105. Similarly, the longitudinally-coupled-resonator SAW filter 102 includes three IDTs 108, 109, and 110, and reflectors 111 and 112 on the sides of the IDTs 108 and 110. The IDTs 103 to 105, and the IDTs 108 to 110 are arranged in a row along a propagation direction of surface acoustic waves. In the SAW device 100, the IDTs 108 and 111 of the longitudinally-coupled-resonator SAW filter 102 are inverted along an interdigital length compared with the IDTs 103 and 105 of the longitudinally-coupled-resonator SAW filter 101. In this arrangement, in the longitudinally-coupled-resonator SAW filter 102, the phase of an output signal to an input signal differs by approximately 180 degrees compared with the longitudinally-coupled-resonator SAW filter 101.

The IDTs 104 and 109 are connected to a signal terminal 113. The IDTs 103 and 105 are connected to a signal terminal 114. The IDTs 108 and 110 are connected to a signal terminal 115. In the SAW device 100, the signal terminal 113 is an unbalanced signal terminal, and the signal terminals 114 and 115 are balanced signal terminals.

Each IDT includes two electrode-finger units each including a bar base-end portion (bus bar) and a plurality of mutually-parallel bar electrode fingers which extend in a perpendicular direction from one side of the base-end portion. Both electrode-finger units are arranged so that the side portions of the electrode fingers of one unit face the side portions of the electrode fingers of the other unit. Also, each reflector is used to reflect transmitted surface acoustic waves. The reflector includes a pair of bar base-end portions (bus bars), and a plurality of mutually-parallel bar electrode fingers which extend in a perpendicular direction from one side of one base-end portion and which electrically connect the base-end portions.

As described above, the SAW device 100 which has a balanced-to-unbalanced conversion function and in which the impedance of balanced signal terminals differs by approximately four times that of an unbalanced signal terminal is realized.

A feature of the SAW device 100 is that the number of electrode fingers in each of the reflectors 111 and 112 is less than that in each of the reflectors 106 and 107. In other words, the longitudinally-coupled-resonator SAW filters 101 and 102 have different numbers of electrode fingers.

As a comparison with the SAW device 100, a SAW device 120 (comparative example 1) which includes two longitudinally-coupled-resonator SAW filters 101' and 102 on a piezoelectric substrate (not shown) is shown in FIG. 20. The SAW device 120 has a configuration in which, in the SAW device 100, instead of the reflectors 106 and 107, reflectors 106' and 107' which are identical in number of electrode fingers to the reflectors 111 and 112 are provided. In other words, in the SAW device 120, the longitudinally-coupled-resonator SAW filters 101' and 102 have the same number of electrode fingers of reflector. The other points in configuration are identical to those in the SAW device 100.

FIG. 21 shows frequency-to-insertion-loss characteristics of the SAW device 100 shown in FIG. 19 and the SAW device 120 shown in FIG. 20. From FIG. 21, it is seen that the configuration of the SAW device 100 has an improvement of approximately 5 dB around 1780 MHz in the passband compared with the SAW device 120. This is an effect of the difference in reflection characteristics of reflector between the longitudinally-coupled-resonator SAW filters 101 and 102.

The configuration of the SAW device 100 in FIG. 19 has a problem in that an attenuation in identical components (common mode) in the lower range of the passband deteriorates. FIG. 22 shows frequency-to-common-mode-attenuation characteristics of the SAW device 100 and SAW device 120. A common mode attenuation around 1640 MHz to 1780 MHz is 30 dB in the SAW device 120, while it deteriorates to 23 dB in the SAW device 100.

This is caused by deterioration in amplitude balance and phase balance in the lower range of the passband due to the difference in reflection characteristics of reflector between the longitudinally-coupled-resonator SAW filters 101 and 102. For recent SAW devices having a balanced-to-unbalanced conversion function, it is required that an attenuation be increased not only in the passband, but also in the common mode outside the passband. The configuration of the SAW device 100 has a technical problem in that the request cannot be satisfied.

SUMMARY OF THE INVENTION

In order to overcome the problems described above, preferred embodiments of the present invention provide a surface acoustic wave device which maintains attenuation characteristics in the vicinity of a passband outside the passband and which has a balanced-to-unbalanced conversion function in which a common mode is improved, and a communication apparatus including such a novel surface acoustic wave device.

According to a preferred embodiment of the present invention, a surface acoustic wave device includes a piezoelectric substrate, and first and second surface-acoustic-wave filter elements which are arranged on the piezoelectric substrate so as to have a balanced-to-unbalanced conversion function, and each of the first and second surface-acoustic-wave filter elements includes at least two interdigital transducers arranged along a propagation direction of surface acoustic waves, and a first reflector and a second reflector which are arranged so that the at least two interdigital transducers are provided along the propagation direction between the first and second reflectors. The first and second reflectors differ in structure. In the first and second surface-acoustic-wave filter elements, the first reflectors have the same structure, and the second reflectors have the same structure.

In other words, the first and second reflectors may differ in structure in the first surface-acoustic-wave filter element, and the first and second reflectors may differ in structure in the second surface-acoustic-wave filter element. Also, the first and second reflectors of the first surface-acoustic-wave filter element and the corresponding first and second reflectors of the second surface-acoustic-wave filter element may have the same structure.

According to the above-described configuration, a surface acoustic wave device includes at least two IDTs arranged in a direction in which surface acoustic waves are transmitted. Thus, the surface acoustic wave device can perform a filtering function in which an electric signal having a passband frequency determined by conversion between an electric signal in each IDT and the surface acoustic waves is allowed to pass with low deterioration and which an electric signal outside the passband is reduced.

In the above-described unique configuration, first and second surface-acoustic-wave filter elements are arranged so as to have a balanced-to-unbalanced conversion function. Thus, the surface acoustic wave device can perform the balanced-to-unbalanced conversion function.

In the above-described unique configuration, first and second reflectors differ in structure. Thus, outside the passband, particularly in the vicinity of the passband, a spurious component, which is unnecessary, can be prevented from being generated to increase an attenuation, so that the required attenuation can be obtained.

In addition, two surface-acoustic-wave filter elements include first reflectors which are preferably substantially identical in structure and second reflectors which are preferably substantially identical in structure. Thus, amplitude balance and phase balance in the lower range of the passband can be improved. Accordingly, a surface acoustic wave device which has a large attenuation in the lower range of the passband and a large common mode attenuation can be provided.

Preferably, the number of electrode fingers of the first reflectors differs from that of electrode fingers of the second reflectors in the respective surface-acoustic-wave filter elements.

Preferably, the duty of the first reflectors differs from that of the second reflectors in the respective surface-acoustic-wave filter elements.

Preferably, the electrode-finger pitch of the first reflectors differs from that of the second reflectors in the respective surface-acoustic-wave filter elements.

According to another preferred embodiment of the present invention, a surface acoustic wave device includes a piezoelectric substrate, and first and second surface-acoustic-wave filter elements which are arranged on the piezoelectric substrate so as to have a balanced-to-unbalanced conversion function, and each of the first and second surface-acoustic-wave filter elements includes at least two interdigital transducers arranged along a propagation direction of surface acoustic waves, and a first reflector and a second reflector which are arranged so that the at least two interdigital transducers are provided along the propagation direction between the first and second reflectors. In each of the first and second surface-acoustic-wave filter elements, a first center-to-center distance of the adjacent electrode fingers between the first reflector and one interdigital transducer adjacent thereto differs from a second center-to-center distance of the adjacent electrode fingers between the second reflector and one interdigital transducer adjacent thereto, and the first and second center-to-center distances of the first surface-acoustic-wave filter element is the same as the corresponding first and second center-to-center distances of the second surface-acoustic-wave filter element.

According to the above-described unique configuration, the difference in structure between first and second reflectors can reduce a spurious component, which is unnecessary, outside the passband, particularly, in the vicinity of the passband, thus increasing an attenuation. Thus, the required attenuation can be easily obtained.

According to another preferred embodiment of the present invention, a surface acoustic wave device includes a piezoelectric substrate, and first and second surface-acoustic-wave filter elements which are arranged on the piezoelectric substrate so as to have a balanced-to-unbalanced conversion function, and each of the first and second surface-acoustic-wave filter elements includes at least two interdigital transducers arranged along a propagation direction of surface acoustic waves, and a first reflector and a second reflector which are arranged so that the at least two interdigital transducers are provided along the propagation direction between the first and second reflectors. The first and second reflectors are weighted by apodization, and in the first and second surface-acoustic-wave filter elements, the first reflectors have the same structure, and the second reflectors have the same structure.

This can prevent a spurious component from being generated outside the passband, particularly, in the vicinity of the passband. Thus, the required attenuation can be increased, thus obtaining the required attenuation.

According to another preferred embodiment of the present invention, a surface acoustic wave device includes a piezoelectric substrate, and first and second surface-acoustic-wave filter elements which are arranged on the piezoelectric substrate so as to have a balanced-to-unbalanced conversion function, and each of the first and second surface-acoustic-wave filter elements includes at least two interdigital transducers arranged along a propagation direction of surface acoustic waves, and a first reflector and a second reflector which are arranged so that the at least two interdigital transducers are arranged along the propagation direction between the first and second reflectors. In at least one of the first reflector and/or the second reflector, at least one of an electrode-finger width and an electrode-finger gap differs compared with surrounding electrode fingers, and in the first and second surface-acoustic-wave filter elements, the first reflectors have the same structure, and the second reflectors have the same structure.

This can prevent a spurious component from being generated outside the passband, particularly, in the vicinity of the passband. Thus, the required attenuation can be increased, thus obtaining the required attenuation.

According to another preferred embodiment of the present invention, a surface acoustic wave device includes a piezoelectric substrate, and first and second surface-acoustic-wave filter elements which are arranged on the piezoelectric substrate so as to have a balanced-to-unbalanced conversion function, and each of the first and second surface-acoustic-wave filter elements includes at least two interdigital transducers arranged along a propagation direction of surface acoustic waves, and a first reflector and a second reflector which are arranged so that the at least two interdigital transducers are arranged along the propagation direction between the first and second reflectors. In at least one of the first reflector and/or the second reflector, a duty differs compared with surrounding electrode fingers, and in said first and second surface-acoustic-wave filter elements, the first reflectors have the same structure, and the second reflectors have the same structure.

This can prevent a spurious component from being generated outside the passband, particularly, in the vicinity of the passband. Thus, the required attenuation can be increased, thus obtaining the required attenuation.

The surface acoustic wave device according to the preferred embodiment described above preferably includes another surface-acoustic-wave filter element which is cascade-connected.

According to another preferred embodiment of the present invention, a surface acoustic wave device includes a piezoelectric substrate, and first, second, third, and fourth surface-acoustic-wave filter elements which are arranged on the piezoelectric substrate so as to have a balanced-to-unbalanced conversion function, and each of the first, second, third and fourth surface-acoustic-wave filter elements include at least two interdigital transducers arranged along a propagation direction of surface acoustic waves, and a set of reflectors arranged so that the at least two interdigital transducers are provided along the propagation direction between opposite reflectors of the set of reflectors. The first and third surface-acoustic-wave filter elements are cascade-connected to each other, and the second and fourth surface-acoustic-wave filter elements are cascade-connected to each other. The first and second surface-acoustic-wave filter elements have the same sets of reflectors, and the third and fourth surface-acoustic-wave filter elements have the same sets of reflectors. The sets of reflectors in the first and second surface-acoustic-wave filter elements differ in structure from the sets of reflectors in the third and fourth surface-acoustic-wave filter elements.

According to another preferred embodiment of the present invention, a surface acoustic wave device includes a piezoelectric substrate, and first, second, third, and fourth surface-acoustic-wave filter elements which are arranged on the piezoelectric substrate so as to have a balanced-to-unbalanced conversion function, and each of the first, second, third and fourth surface-acoustic-wave filter elements includes at least two interdigital transducers arranged along a propagation direction of surface acoustic waves, and a set of reflectors arranged so that the at least two interdigital transducers are provided along the propagation direction between opposite reflectors of the set of reflectors. The first and third surface-acoustic-wave filter elements are cascade-connected to each other, and the second and fourth surface-acoustic-wave filter elements are cascade-connected to each other. The first and fourth surface-acoustic-wave filter elements have the same sets of reflectors, and the second and third surface-acoustic-wave filter elements have the same sets of reflectors. The sets of reflectors in the first and fourth surface-acoustic-wave filter elements differ in structure from the sets of reflectors in the second and third surface-acoustic-wave filter elements.

According to the above-described unique configuration, a surface acoustic wave device includes at least two IDTs arranged along a direction in which surface acoustic waves are transmitted. Thus, the surface acoustic wave device can perform a filtering function in which an electric signal having a passband frequency determined by conversion between an electric signal in each IDT and the surface acoustic waves is allowed to pass with low deterioration and which an electric signal outside the passband is reduced.

In the above-described unique configuration, surface-acoustic-wave filter elements are arranged so as to have a balanced-to-unbalanced conversion function. Thus, the surface acoustic wave device can perform the balanced-to-unbalanced conversion function.

In addition, in the above-described configuration, the reflectors can reflect surface acoustic waves from one IDT to another IDT. Thus, an efficiency at which the generated surface acoustic waves are converted into an electric signal can be increased.

In the above-described unique configuration, reflectors in a first surface-acoustic-wave filter element differ in structure from those in a third surface-acoustic-wave filter element, and reflectors in a second surface-acoustic-wave filter element differ in structure from those in a fourth surface-acoustic-wave filter element. Thus, outside the passband, particularly in the vicinity of the passband, a spurious component, which is unnecessary, can be prevented from being generated to increase an attenuation, so that the required attenuation can be obtained.

In addition, among the four surface-acoustic-wave filter elements, reflectors in a first surface-acoustic-wave filter element preferably have substantially identical structure to those in a second surface-acoustic-wave filter element, and reflectors in a third surface-acoustic-wave filter element preferably have substantially identical structure to those in a fourth surface-acoustic-wave filter element. Thus, amplitude balance and phase balance in the lower range of the passband are improved. Accordingly, a surface acoustic wave device which has a large attenuation in the lower range of the passband and a large common mode attenuation can be provided.

In the surface acoustic wave device, preferably, the number of electrode fingers of the reflector of a first surface-acoustic-wave filter element differs from that of the reflector of a third surface-acoustic-wave filter element, and the number of electrode fingers of the reflector of a second surface-acoustic-wave filter element differs from that of the reflector of a fourth surface-acoustic-wave filter element.

In the surface acoustic wave device, preferably, the duty of the reflector of a first surface-acoustic-wave filter element differs from that of the reflector of a third surface-acoustic-wave filter element, and the duty of the reflector of a second surface-acoustic-wave filter element differs from that of the reflector of a fourth surface-acoustic-wave filter element.

In the surface acoustic wave device, preferably, the electrode-finger pitch of the reflector of a first surface-acoustic-wave filter element differs from that of the reflector of a third surface-acoustic-wave filter element, and the electrode-finger pitch of the reflector of a second surface-acoustic-wave filter element differs from that of the reflector of a fourth surface-acoustic-wave filter element.

According to another preferred embodiment of the present invention, a surface acoustic wave device includes a piezoelectric substrate, and first, second, third, and fourth surface-acoustic-wave filter elements which are arranged on the piezoelectric substrate so as to have a balanced-to-unbalanced conversion function, and each of the first, second, third, and fourth surface-acoustic-wave filter elements include at least two interdigital transducers arranged along a propagation direction of surface acoustic waves, and a set of reflectors arranged so that the at least two interdigital transducers are provided along the propagation direction between opposite reflectors of the set of reflectors. The first and third surface-acoustic-wave filter elements are cascade-connected to each other, and the second and fourth surface-acoustic-wave filter elements are cascade-connected to each other. A center-to-center distance of the adjacent electrode fingers between one of the reflectors in the first surface-acoustic-wave filter element and one interdigital transducer adjacent thereto differs from a center-to-center distance of the adjacent electrode fingers between one of the reflectors in the third surface-acoustic-wave filter element and one interdigital transducer adjacent thereto. A center-to-center distance of the adjacent electrode fingers between one of the reflectors in the second surface-acoustic-wave filter element and one interdigital transducer adjacent thereto differs from a center-to-center distance of the adjacent electrode fingers between one of the reflectors in the fourth surface-acoustic-wave filter element and one interdigital transducer adjacent thereto. A center-to-center distance of the adjacent electrode fingers between one of the reflectors in the first surface-acoustic-wave filter element and one interdigital transducer adjacent thereto is equal to a center-to-center distance of the adjacent electrode fingers between one of the reflectors in the second surface-acoustic-wave filter element and one interdigital transducer adjacent thereto. A center-to-center distance of the adjacent electrode fingers between one of the reflectors in the third surface-acoustic-wave filter element and one interdigital transducer adjacent thereto is equal to a center-to-center distance of the adjacent electrode fingers between one of the reflectors in the fourth surface-acoustic-wave filter element and one interdigital transducer adjacent thereto.

In the above-described unique configuration, reflectors in a first surface-acoustic-wave filter element differ in structure from those in a third surface-acoustic-wave filter element, and reflectors in a second surface-acoustic-wave filter element differ in structure from those in a fourth surface-acoustic-wave filter element. Thus, outside the passband, particularly in the vicinity of the passband, a spurious component, which is unnecessary, can be prevented from being generated to increase an attenuation, so that the required attenuation can be obtained.

According to another preferred embodiment of the present invention, a surface acoustic wave device includes a piezoelectric substrate, and first, second, third, and fourth surface-acoustic-wave filter elements which are arranged on the piezoelectric substrate so as to have a balanced-to-unbalanced conversion function, and each of the first, second, third, and fourth surface-acoustic-wave filter elements includes at least two interdigital transducers arranged along a propagation direction of surface acoustic waves, and a set of reflectors arranged so that the at least two interdigital transducers are provided along the propagation direction between opposite reflectors of the set of reflectors. The first and third surface-acoustic-wave filter elements are cascade-connected to each other, and the second and fourth surface-acoustic-wave filter elements are cascade-connected to each other. A center-to-center distance of the adjacent electrode fingers between one of the reflectors in the first surface-acoustic-wave filter element and one interdigital transducer adjacent thereto differs from a center-to-center distance of the adjacent electrode fingers between one of the reflectors in the third surface-acoustic-wave filter element and one interdigital transducer adjacent thereto. A center-to-center distance of the adjacent electrode fingers between one of the reflectors in the second surface-acoustic-wave filter element and one interdigital transducer adjacent thereto differs from a center-to-center distance of the adjacent electrode fingers between one of the reflectors in the fourth surface-acoustic-wave filter element and one interdigital transducer adjacent thereto. A center-to-center distance of the adjacent electrode fingers between one of the reflectors in the first surface-acoustic-wave filter element and one interdigital transducer adjacent thereto is equal to a center-to-center distance of the adjacent electrode fingers between one of the reflectors in the fourth surface-acoustic-wave filter element and one interdigital transducer adjacent thereto. A center-to-center distance of the adjacent electrode fingers between one of the reflectors in the second surface-acoustic-wave filter element and one interdigital transducer adjacent thereto is equal to a center-to-center distance of the adjacent electrode fingers between one of the reflectors in the third surface-acoustic-wave filter element and one interdigital transducer adjacent thereto.

According to the above-described unique configuration, reflectors in a first surface-acoustic-wave filter element differ in structure from those in a third surface-acoustic-wave filter element, and reflectors in a second surface-acoustic-wave filter element differ in structure from those in a fourth surface-acoustic-wave filter element. Thus, outside the passband, particularly in the vicinity of the passband, a spurious component, which is unnecessary, can be prevented from being generated to increase an attenuation, so that the required attenuation can be obtained.

According to a further preferred embodiment of the present invention, a communication apparatus includes one of the surface acoustic wave devices according to preferred embodiments of the present invention described above.

According to various preferred embodiments of the present invention, by providing a configuration in which a surface acoustic wave device having a large attenuation in the lower range of the passband and a large common mode attenuation, a communication apparatus which has a large attenuation in the lower range of the passband and a large common mode attenuation can be provided.

Other features, elements, steps, characteristics and advantages of the present invention will become more apparent from the following detailed description of preferred embodiments thereof with reference to the attached drawings.

DETAILED DESCRIPTION OF PREFERRED EMBODIMENTS

Preferred Embodiment 1

One preferred embodiment of the present invention is described below with reference to FIGS. 1 to 11. In this preferred embodiment, a surface acoustic wave device for reception in a digital communication system (DCS) is described as an example.

Figure 1:
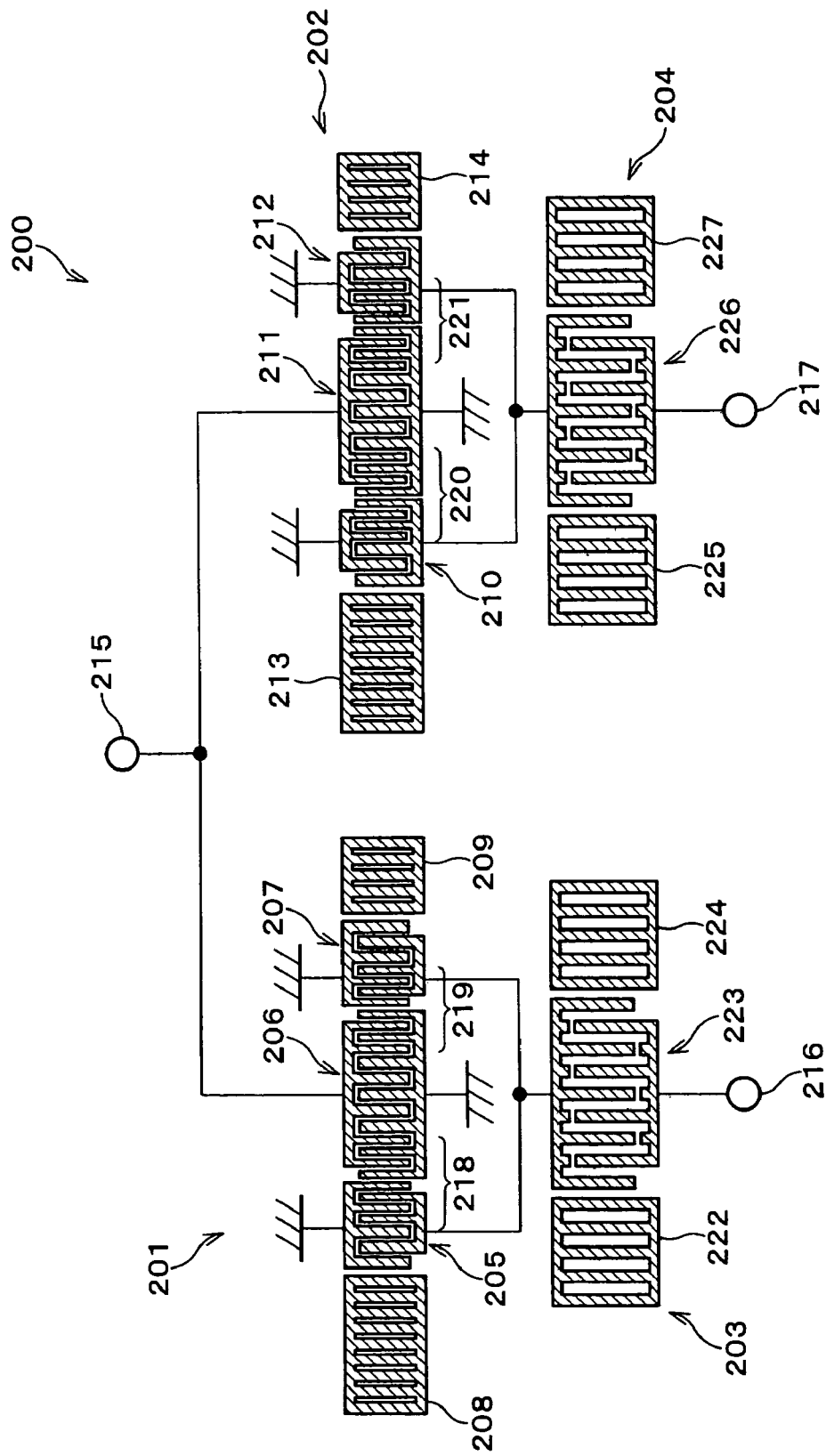
FIG. 1 is a schematic block diagram of a surface acoustic wave (SAW) device according to a preferred embodiment of the present invention.

FIG. 1 shows the configuration of main components of a SAW device 200 according to this preferred embodiment. The SAW device 200 includes, on a piezoelectric substrate (not shown), two longitudinally-coupled-resonator SAW filters 201 and 202, and SAW filters 203 and 204 which are respectively connected in series to the SAW filters 201 and 202. The longitudinally-coupled-resonator SAW filters 201 and 202, and the SAW resonators 203 and 204 preferably include aluminum electrodes. In this preferred embodiment, a 40±5-degree Y-cut X-transmission $LiTaO_3$ substrate is preferably used as the piezoelectric substrate. The SAW device 200 uses the longitudinally-coupled-resonator SAW filters 201 and 202 to have a balanced-to-unbalanced conversion function. Here, an example is mentioned in which, in the SAW device 200, the impedance of an unbalanced signal terminal is about 50 Ω, and the impedance of a balanced signal terminal is about 150 Ω.

In the configuration of the longitudinally-coupled-resonator SAW filter 201, interdigital transducers (IDTs) 205 and 207 are arranged with an IDT 206 provided therebetween, and reflectors 208 and 209 are arranged on the sides of the IDTs 205 and 207. As shown in FIG. 1, the IDTs 205 and 206, which are adjacent to each other, and the IDTs 206 and 207, which are adjacent to each other, each have an electrode-finger pitch that is narrower than that in the portions of the other IDTs (narrow-pitch electrode-finger portions 218 and 219). In the configuration of the longitudinally-coupled-resonator SAW filter 202, IDTs 210 and 212 are arranged with an IDT 211 provided therebetween, and reflectors 213 and 214 are arranged on the sides of both reflectors.

As in the longitudinally-coupled-resonator SAW filter 201, a narrow-pitch electrode-finger portion 220 is provided between the IDTs 210 and 211, and a narrow-pitch electrode-finger portion 221 is provided between the IDTs 211 and 212. Also, the directions of the IDTs 210 and 212 in the longitudinally-coupled-resonator SAW filter 202 have an inverse relationship in interdigital length with the IDTs 205 and 207 in the longitudinally-coupled-resonator SAW filter 201. Thus, the phase of an output signal to an input signal in the longitudinally-coupled-resonator SAW filter 202 is inverted approximately 180 degrees compared with the longitudinally-coupled-resonator SAW filter 201.

In this preferred embodiment, the IDT 206 in the longitudinally-coupled-resonator SAW filter 201 and the IDT 211 in the longitudinally-coupled-resonator SAW filter 202 are connected to an unbalanced signal terminal 215. The IDTs 205 and 207 in the longitudinally-coupled-resonator SAW filter 201 are connected to a balanced signal terminal 216, and the IDTs 210 and 212 in the longitudinally-coupled-resonator SAW filter 202 are connected to a balanced signal terminal 217.

Both the SAW resonators 203 and 204 are preferably substantially the same in structure. Reflectors 222 and 224 are arranged with an IDT 223 provided therebetween, and reflectors 225 and 227 are arranged with an IDT 226 provided therebetween.

Figure 2:
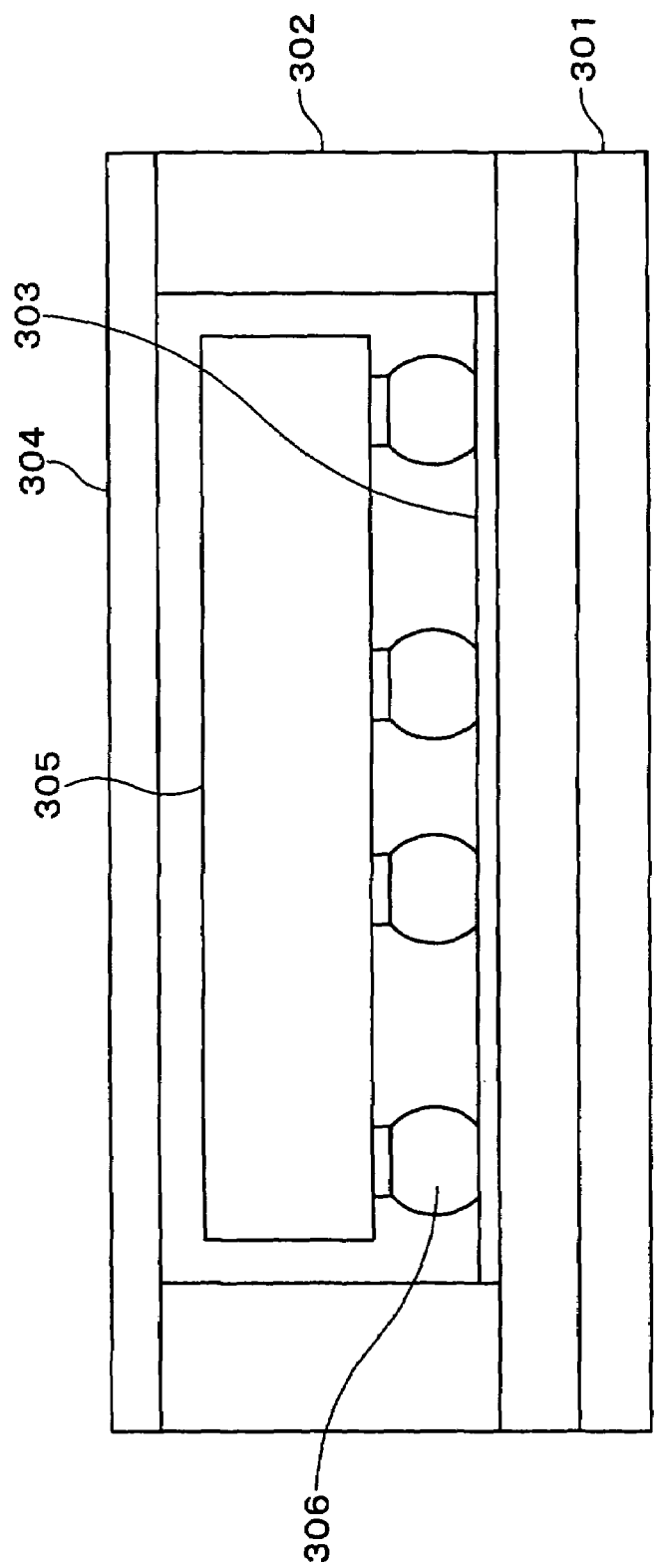
FIG. 2 is a sectional view of main portions of the SAW device according to a preferred embodiment of the present invention which is accommodated in a package.

Next, a sectional view of a SAW device accommodated in a package in this preferred embodiment is shown in FIG. 2. The SAW device has a structure formed by a flip-chip technique in which conduction between the package and a piezoelectric substrate 305 on which a SAW filter is established by bump bonding portions 306.

The package preferably has a two layer structure, and has a bottom plate 301, side walls 302, a die-attach surface 303, and a cap 304. The bottom plate 301 is, for example, substantially rectangular, and in the four peripheral portions thereof, the side walls 302 are arranged in a standing manner. The cap 303 covers an opening formed by the side walls 203. On the top (internal) surface of the bottom plate 301, the die-attach surface 303 is provided, which establishes conduction with the piezoelectric substrate 305. The piezoelectric substrate 305 and the die-attach surface 303 are connected to each other by the bump bonding portion 306.

Also, in the SAW device 200, which is preferably a longitudinally-coupled-resonator type, the number of electrode fingers of the reflector 209 differs from that of the reflector 208, and the number of electrode fingers on the reflector 214 differs from that of the reflector 214. The reflectors 208 and 213 have the same number of electrode fingers, and the reflectors 209 and 214 have the same number of electrode fingers.

One example of a detailed design of each of the longitudinally-coupled-resonator SAW filters 201 and 202 is as follows:

When a wavelength determined by the pitch of electrode fingers in a case in which the pitch is not narrowed is represented by $\lambda l$, the interdigital length is about 41.8 $\lambda l$.

the number of electrode fingers of each IDT: (in the order of IDTs 205, 206, and 207): 18 (3)/(3) 33 (3)/(3) 18 (each parenthesized number indicates the number of electrode fingers having a narrowed pitch)

the number of electrode fingers of each reflector: 60 (reflectors 208 and 213); 90 (reflectors 209 and 214)

duty: about 0.72 (IDT); about 0.57 (reflector)

electrode film thickness: about 0.092 $\lambda l$

In addition, an example of a detailed design of each of the SAW resonators 203 and 204 is as follows:

interdigital length: about 34.9 $\lambda l$ the number of electrode fingers of each IDT: 250 the number of electrode fingers of each reflector: 15 duty: about 0.60 electrode film thickness: about 0.093 $\lambda l$

Figure 3:
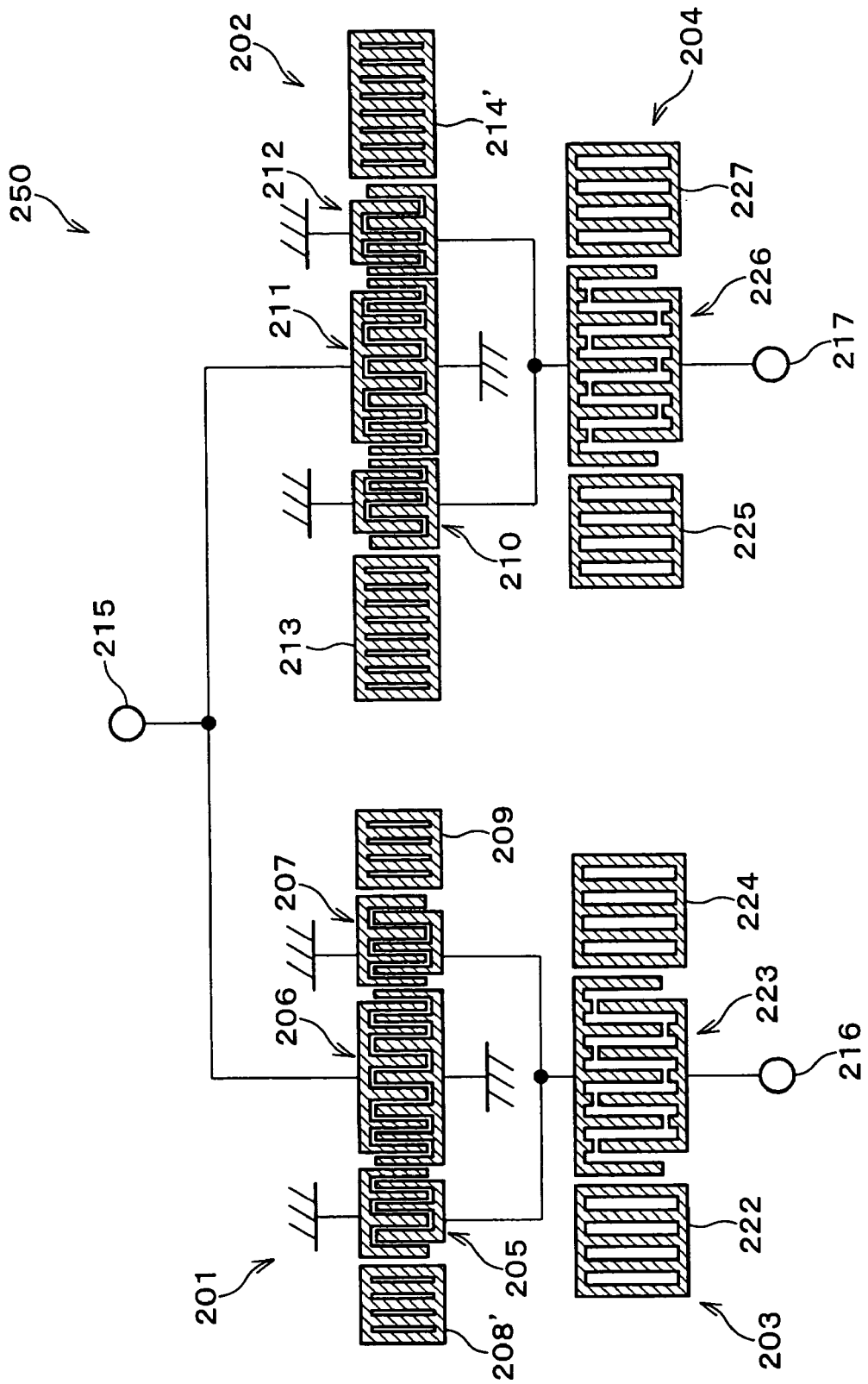
FIG. 3 is a schematic block diagram of a SAW device according to comparative example 2.

As a comparison with the SAW device 200 according to this preferred embodiment, a SAW device 250 corresponding to comparative example 2 is shown in FIG. 3. The SAW device 250 has a configuration in which the reflectors 208 and 214 in the SAW device 200 are replaced by reflectors 208' and 214'. The reflector 208' is identical in structure to the reflector 209, and the reflector 214 is identical in structure to the reflector 213. In other words, regarding design parameters in the SAW device 250, each of the number of the reflectors 208' and the number of the reflectors 209 is set to 60, and each of the number of the reflectors 213 and the number of the reflectors 214' is set to 90. The other design parameters are similar to those in the SAW device 200.

Figure 4:
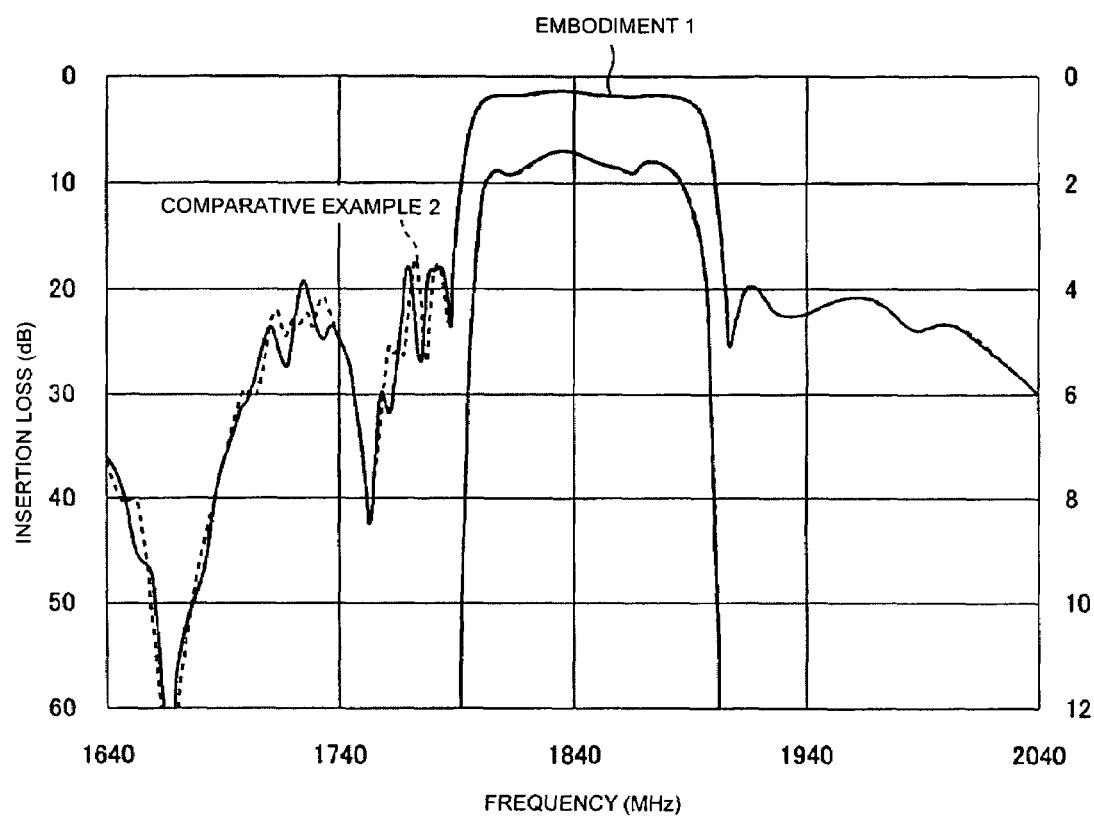
FIG. 4 is a graph showing acoustic-frequency-to-insertion-loss characteristics of the SAW device in FIG. 1 and the SAW device (comparative example 2) in FIG. 2.
Figure 5:
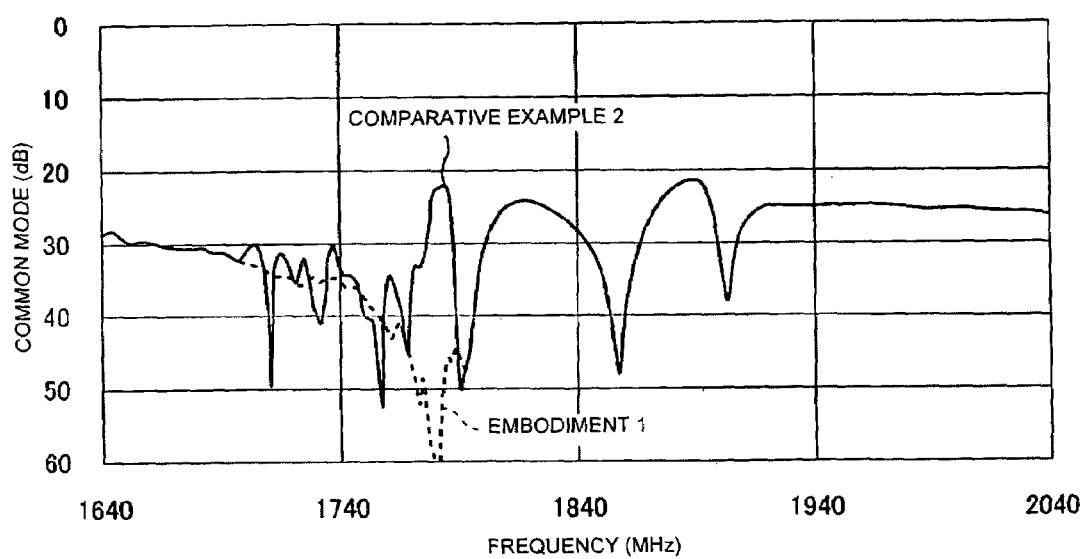
FIG. 5 is a graph showing frequency-to-common-mode-attenuation characteristics of the SAW device in FIG. 1 and the SAW device (comparative example 2) in FIG. 2.
Figure 6:
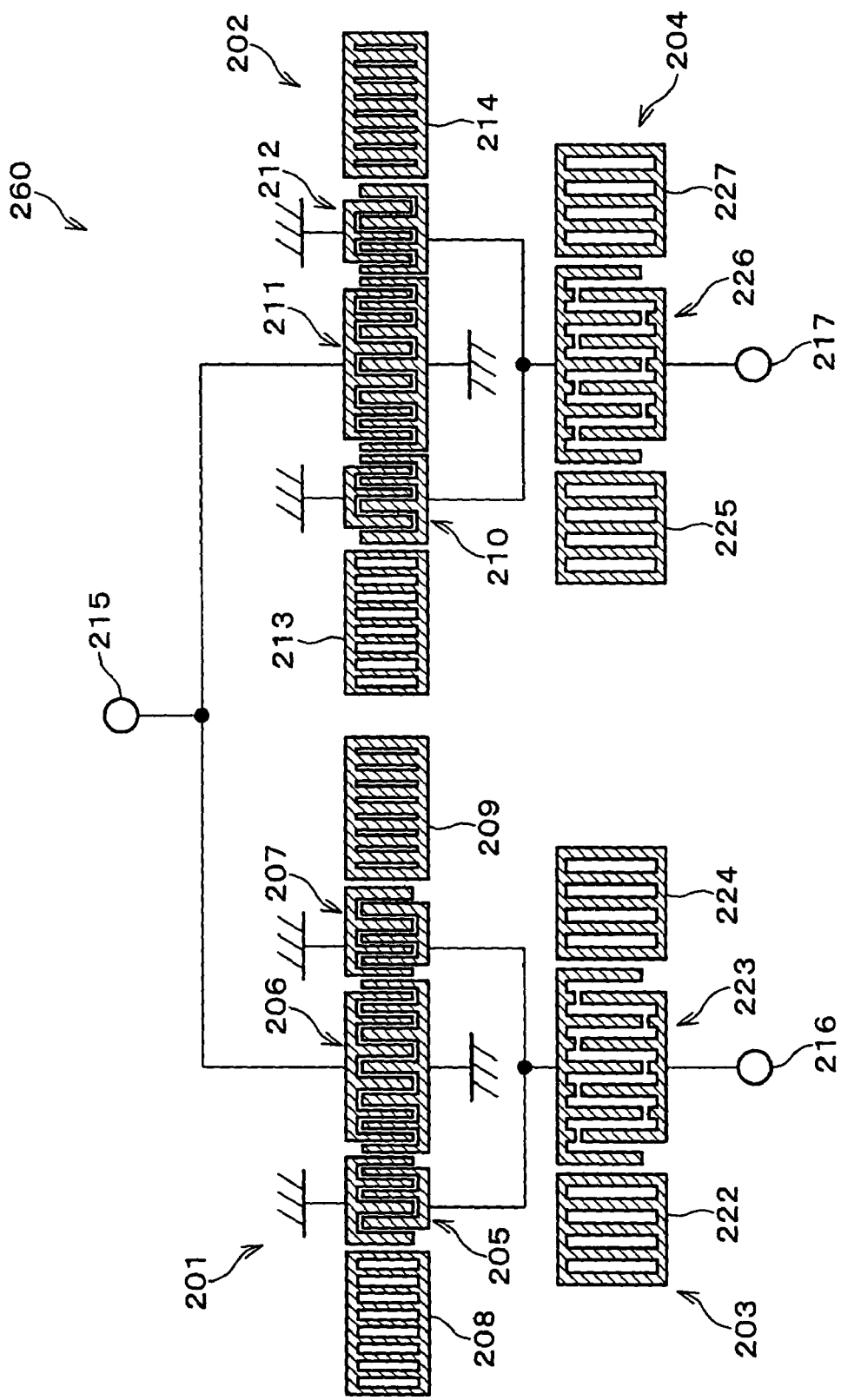
FIG. 6 is a schematic block diagram of a modification of the SAW device in FIG. 1.

The frequency-to-insertion-loss characteristics of the SAW device 200 and the SAW device 250 in the comparative example 2 are shown in FIG. 4, and the frequency-to-common-mode-attenuation characteristics of the SAW device 200 and the SAW device 250 in the comparative example 2 are shown in FIG. 5.

Referring to FIG. 4, it is seen that there is almost no difference in attenuation around 1780 MHz in the passband between the SAW device 200 and the SAW device 250 in the comparative example 2. This is because, by setting the number of electrode fingers of the reflector 209 to differ from that of the reflector 208, and setting the number of electrode fingers of the reflector 214 to differ from that of the reflector 213, a change of reflection characteristics of the reflector which occurs in the lower range of the passband can be cancelled, thus improving a spurious component in the lower range of the passband.

Also, referring to FIG. 5, the SAW device 250 in the comparative example 2 has a common mode attenuation of approximately 23 dB around 1640 MHz to 1780 MHz, while the SAW device 200 has an attenuation of approximately 30 dB. In other words, it is found that the common mode attenuation is greatly improved. This improvement in common mode attenuation is an effect of improving the amplitude balance and phase balance of the lower range of the passband in the longitudinally-coupled-resonator SAW filters 201 and 202 compared with the SAW device in the comparative example 2 by setting the numbers of electrode fingers of the reflectors 208 and 213 to be equal, and setting the numbers of electrode fingers of the reflectors 209 and 214 to be equal. This effect can be also obtained by equalizing the numbers of electrode fingers of the reflectors 208 and 214, and equalizing the numbers of electrode fingers of the reflectors 209 and 213.

As described above, in the SAW device 200 according to this preferred embodiment, two longitudinally-coupled-resonator SAW filters 201 and 202, in which SAW resonators are connected in series, are used to shift the phases of the longitudinally-coupled-resonator SAW filters 201 and 202 by approximately 180 degrees, thus establishing the balanced-to-unbalanced conversion function.

In addition, the number of electrode fingers of the reflector 209 is preferably set to differ from that of the reflector 208, and the number of electrode fingers of the reflector 208 is preferably set to differ from that of the reflector 213. This can greatly increase an attenuation in the lower range of the passband in the SAW device 200.

Moreover, the numbers of electrode fingers of the reflectors 208 and 214 are preferably equal, and the numbers of electrode fingers of the reflectors 209 and 213 are preferably equal. In other words, the structures of the reflectors 208 and 214 are preferably substantially identical to each other, and the structures of the reflectors 209 and 213 are preferably substantially identical to each other. This can greatly increase the common mode attenuation in the lower range of the passband in the SAW device 200.

Based on these points, a SAW device which has good attenuation characteristics in the vicinity of the passband outside the passband and which has a balanced-to-unbalanced conversion function is obtained. In particular, a SAW device which has a large attenuation in the lower range of the passband and a large common mode attenuation is obtained.

Regarding the SAW device 200 according to this preferred embodiment, a case is shown in which the number of electrode fingers of the reflector 209 differs from that of the reflector 208, and the number of electrode fingers of the reflector 214 differs from that of the reflector 213. However, if there is a difference in a point other than the number of electrode fingers of reflector, almost similar effects can be obtained.

For example, a SAW device 260 (shown in FIG. 6) according to modification 1 has a configuration in which, in the SAW device 200, the duty of the reflector 209 differs from that of the reflector 208, and the duty of the reflector 214 differs from that of the reflector 213.

Also, in the configuration of the SAW device 260, in the SAW device 200, the reflectors 208 and 213 have the same duty, and the reflectors 209 and 214 have the same duty. In other words, the structures of the reflectors 208 and 214 are preferably substantially identical to each other, and the structures of the reflectors 209 and 213 are preferably substantially identical to each other.

Based on these points, a SAW device which has good attenuation characteristics in the vicinity of the passband and which has a balanced-to-unbalanced conversion function is obtained. Also, a SAW device which has a large attenuation in the lower range of the passband and a large common mode attenuation is obtained.

Figure 7:
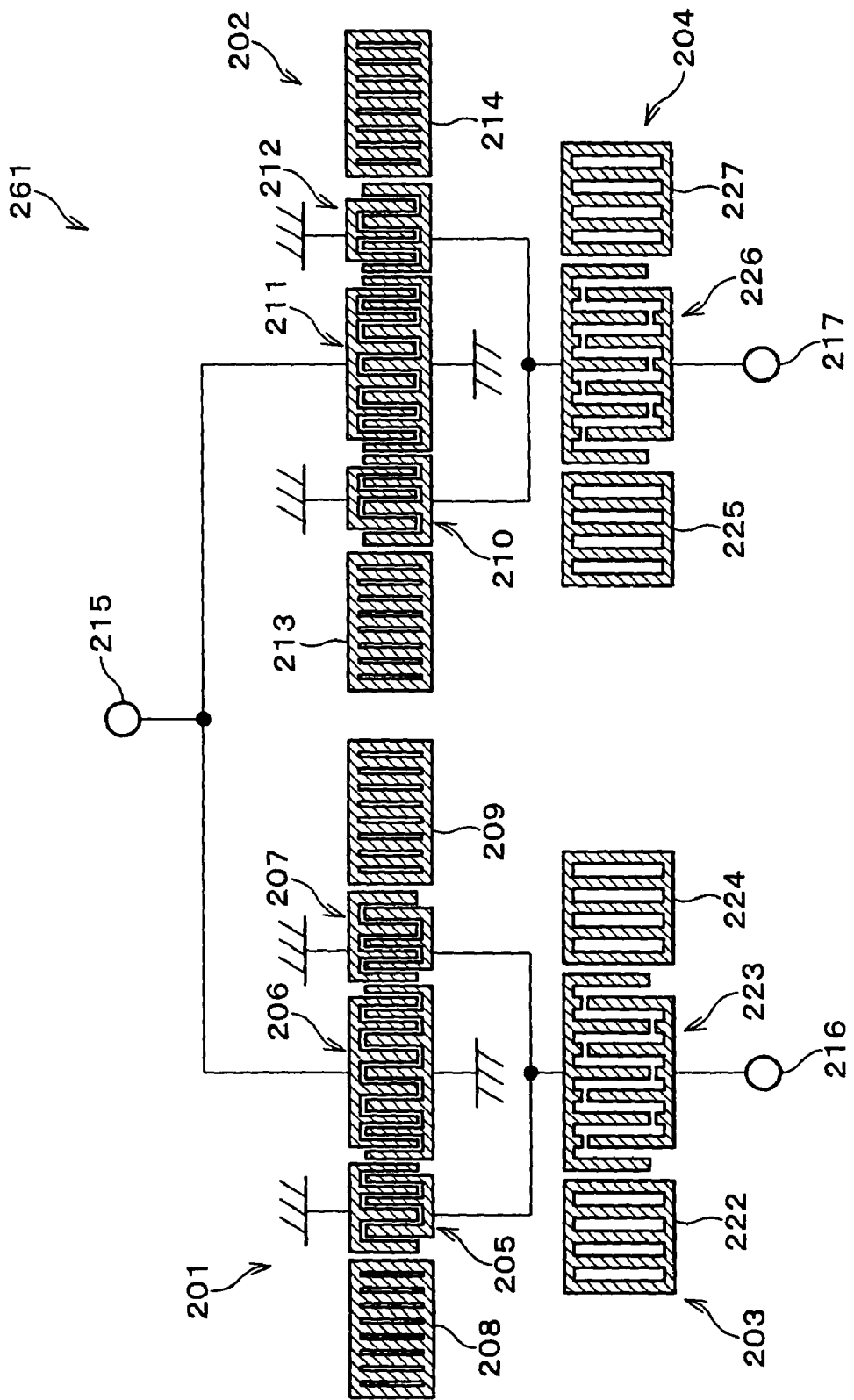
FIG. 7 is a schematic block diagram of another modification of the SAW device in FIG. 1.

Also, as FIG. 7 shows, a SAW device 261 according to modification 2 has a configuration in which, in the SAW device 200, the reflector 209 has an electrode-finger pitch that is different from that of the reflector 208, and the reflector 214 has an electrode-finger pitch different from that of the reflector 213.

Also, in the configuration of the SAW device 260, in the SAW device 200, the reflectors 208 and 213 have the same electrode-finger pitch, and the reflectors 209 and 214 have the same electrode-finger pitch. In other words, the structures of the reflectors 208 and 214 are preferably substantially identical to each other, and the structures of the reflectors 209 and 213 are preferably substantially identical to each other.

Based on these points, a SAW device which has good attenuation characteristics in the vicinity of the passband outside the passband and a balanced-to-unbalanced conversion function is obtained. In particular, a SAW device having a large attenuation in the lower range of the passband and a large common mode attenuation is obtained.

Figure 8:
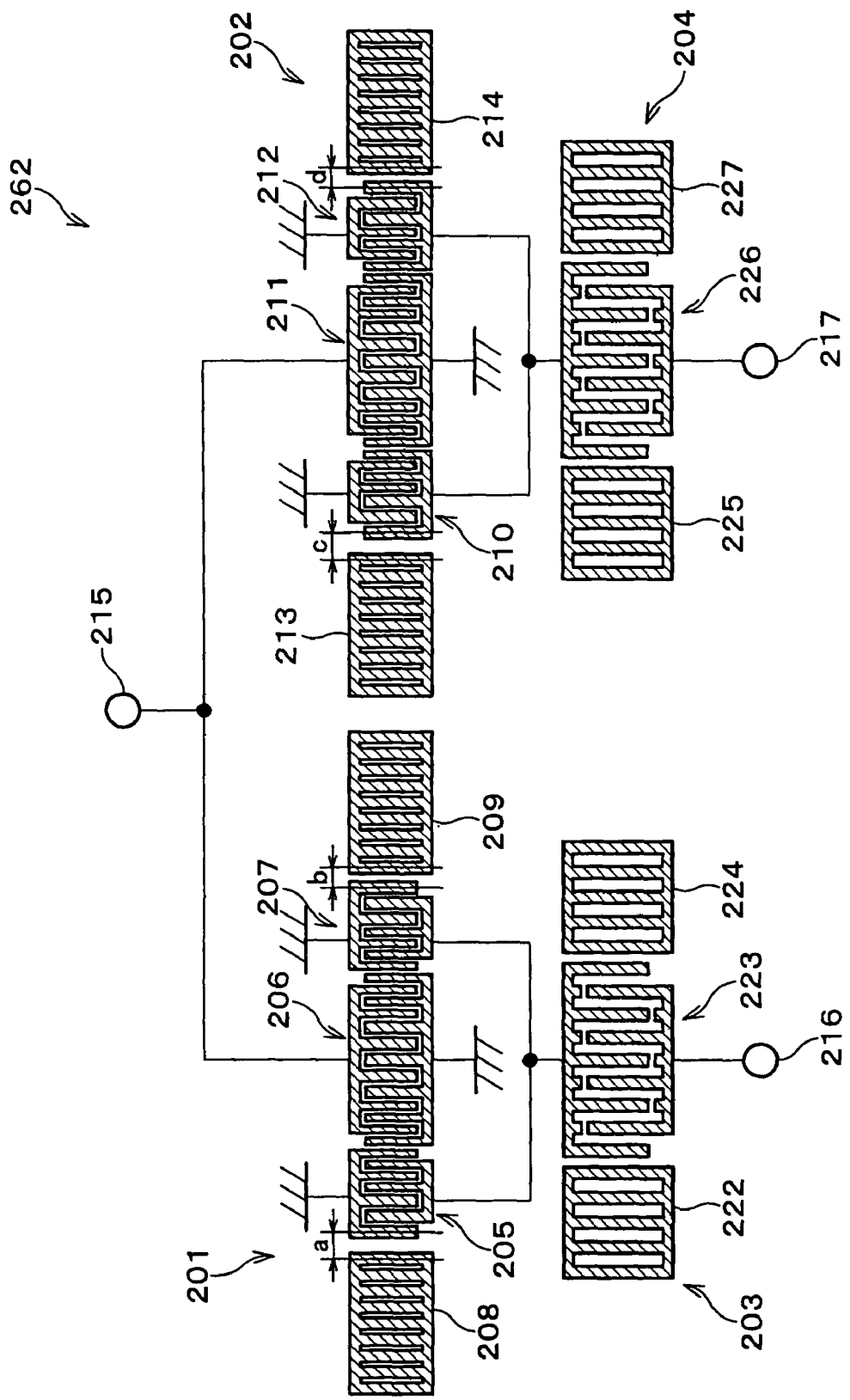
FIG. 8 is a schematic block diagram of a further modification of the SAW device in FIG. 1.

Also, as FIG. 8 shows, a SAW device 262 according to modification 3 has a configuration in which, in the SAW device 200, the center-to-center distance of the adjacent electrode fingers a between the reflector 208 and the IDT 205 adjacent thereto differs from the center-to-center distance of the adjacent electrode fingers b between the reflector 209 and the IDT 207 adjacent thereto. In the configuration of the SAW device 262, in the SAW device 200, the center-to-center distance of the adjacent electrode fingers c between the reflector 213 and the IDT 210 adjacent thereto differs from the center-to-center distance of the adjacent electrode fingers d between the reflector 214 and the IDT 212 adjacent thereto.

The center-to-center distance of the adjacent electrode fingers a is equal to the center-to-center distance of the adjacent electrode fingers c, and the center-to-center distance of the adjacent electrode fingers b is equal to the center-to-center distance of the adjacent electrode fingers d.

Based on these points, a SAW device which has good attenuation characteristics in the vicinity of the passband outside the passband and a balanced-to-unbalanced conversion function is obtained. Also, a SAW device which has a large attenuation in the lower range of the passband and a large common mode attenuation is obtained.

Figure 9:
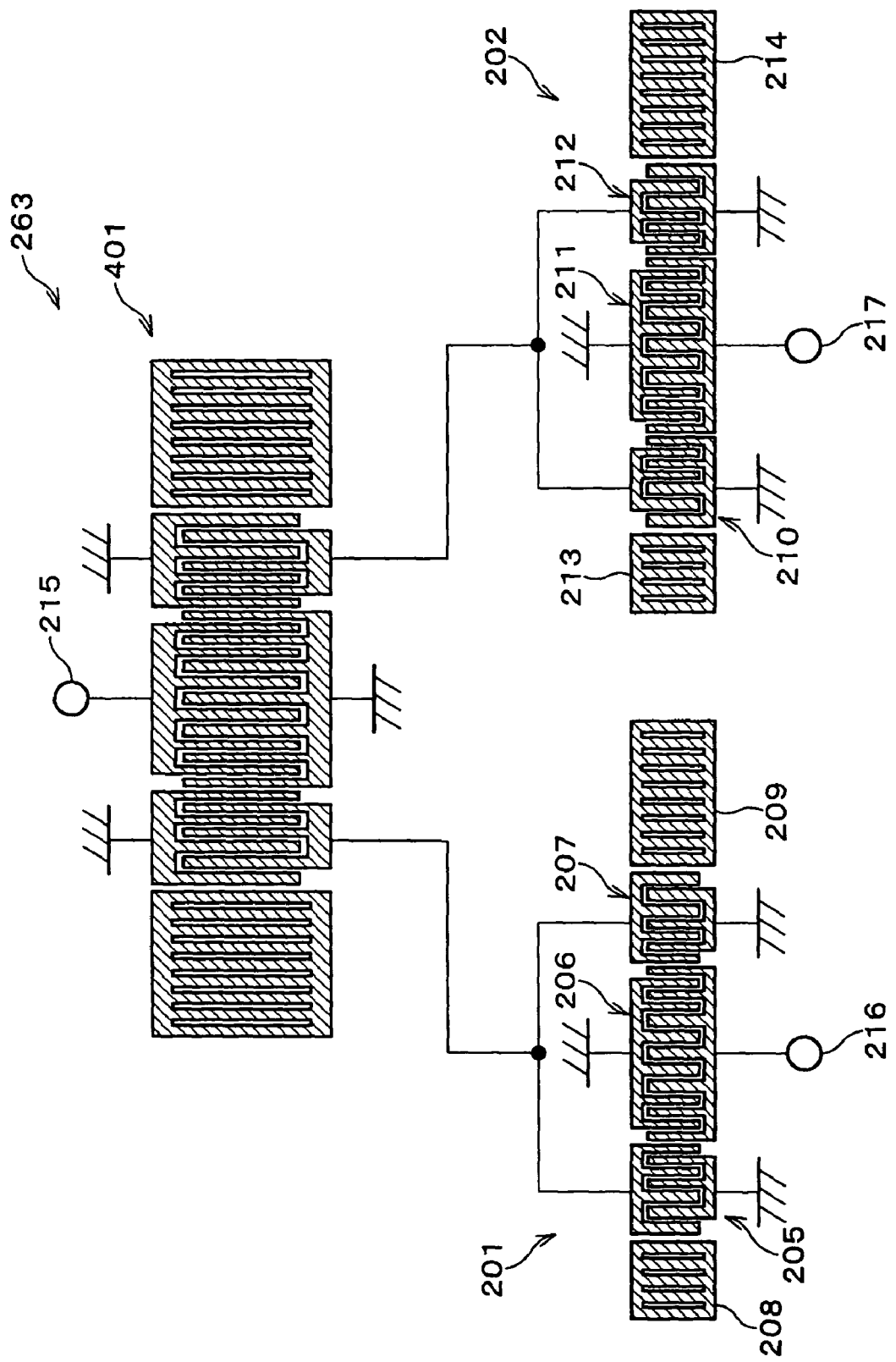
FIG. 9 is a schematic block diagram of a still further modification of the SAW device in FIG. 1.

Also, as FIG. 9 shows, a SAW device 263 according to modification 4 has a configuration in which, in the SAW device 200, a longitudinally-coupled-resonator SAW filter 401 is cascade-connected to the longitudinally-coupled-resonator SAW filters 201 and 202. This can cause the SAW device 263 to have good attenuation characteristics in the vicinity of the passband outside the passband and a balanced-to-unbalanced conversion function. In particular, a SAW device which has a large attenuation in the lower range of the passband and a large common mode attenuation is obtained.

In the SAW device 263, among three IDTs, the phases of two IDTs are inverted, whereby a balanced-to-unbalanced conversion function is obtained. However, the number of electrode fingers of each IDT is not limited to three if the balanced-to-unbalanced conversion function can be obtained. For example, by using IDTs in which at least two phases are inverted, a balanced-to-unbalanced conversion function can be obtained.

Figure 10:
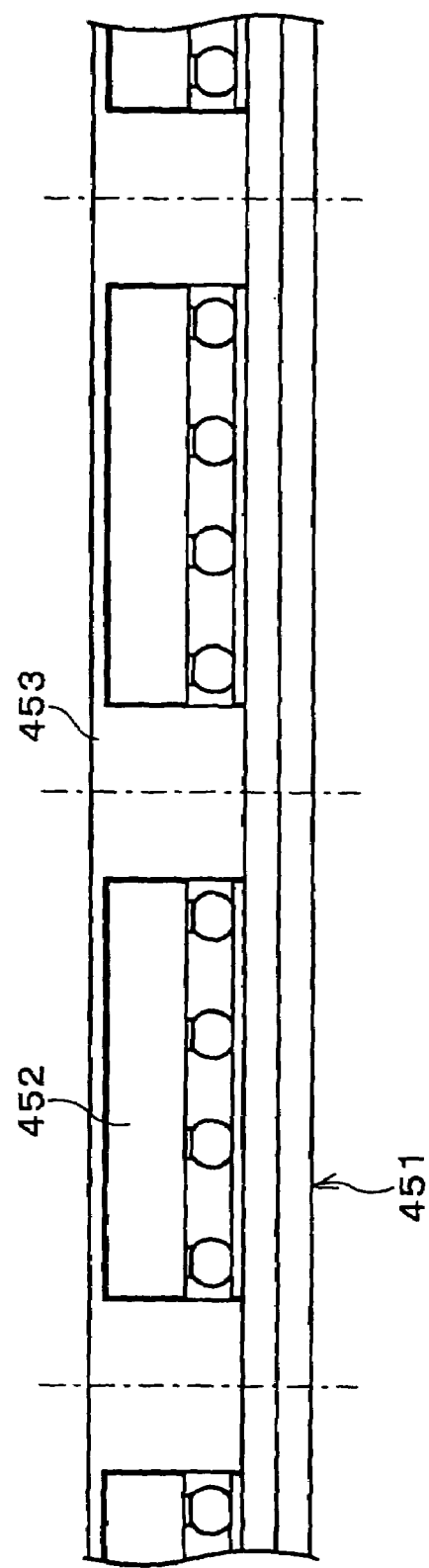
FIG. 10 is a sectional view showing a production process of the SAW device according to a preferred embodiment of the present invention.
Figure 11:
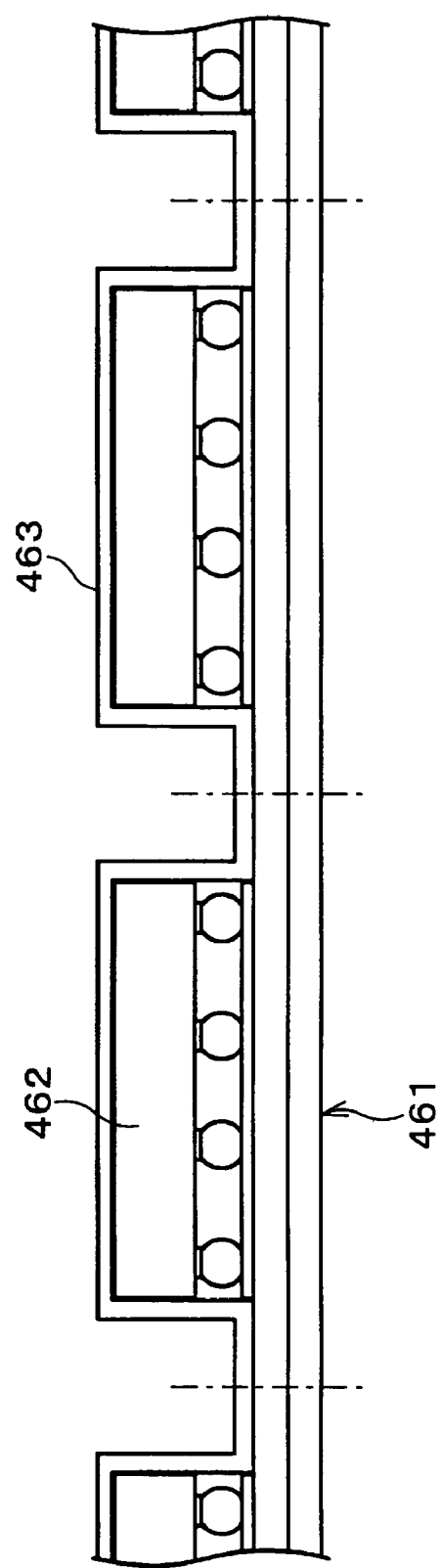
FIG. 11 is a sectional view showing another production process of the SAW device according to a preferred embodiment of the present invention.

In this preferred embodiment, a SAW device which has a configuration in which the SAW device is packaged by using a face-down technique to establish conduction between the package and the piezoelectric substrate has been described with reference to FIG. 2. However, the conduction between the package and the piezoelectric substrate may be established by using a wire-bond technique. In FIG. 2, the face-down technique is used to join one SAW device to one package. However, a joining technique is not limited to the face-down technique. For example, as FIG. 10 shows, a packaged SAW device may be produced by joining a piezoelectric substrate 452 to a mother base 451 by using a flip-chip technique, sealing the mother base 451 and the piezoelectric substrate 452 by covering both with resin 453, and dicing the sealed one in units of packages. Also, as FIG. 11 shows, a packaged SAW device may be produced by joining a piezoelectric substrate 462 to a mother base 461 by using the flip-chip technique, sealing the mother base 461 and the piezoelectric substrate 462 by using the flip-chip technique by covering both with resin material 463, and dicing the sealed one in units of packages.

In the above-described preferred embodiment, the 40±5-degree Y-cut X-transmission LiTaO$_3$ substrate is preferably used. As can be understood from the principle by which the advantages can be obtained, in the present invention, by using not only the above-described substrate, but also substrates such as a 64–72-degree Y-cut X-transmission LiNbO$_3$ substrate, and a 41-degree Y-cut X-transmission LiNbO$_3$ substrate, similar advantages can be obtained.

Preferred Embodiment 2

Another preferred embodiment of the present invention is described below with reference to FIGS. 12 to 14. For brevity of description, by using identical reference numerals to denote members which are identical in function to those described in preferred embodiment 1, a description of the members is omitted.

Preferred embodiment 1 uses a method for reducing a spurious component in the lower range of the passband by using a configuration in which, in the longitudinally-coupled-resonator SAW filters 201 and 202, the reflectors adjacent to (in a direction in which the surface acoustic waves are transmitted) the reflectors 208 and 213 differ in structure and the reflectors adjacent to (in a direction in which the surface acoustic waves are transmitted) the reflectors 209 and 214 differ in structure. In the second preferred embodiment, a method is described which reduces the spurious component in the lower range of the passband by using the right and left reflectors having the same structure. Specific configurations of the SAW device are described below with reference to FIGS. 12 to 14.

Figure 12:
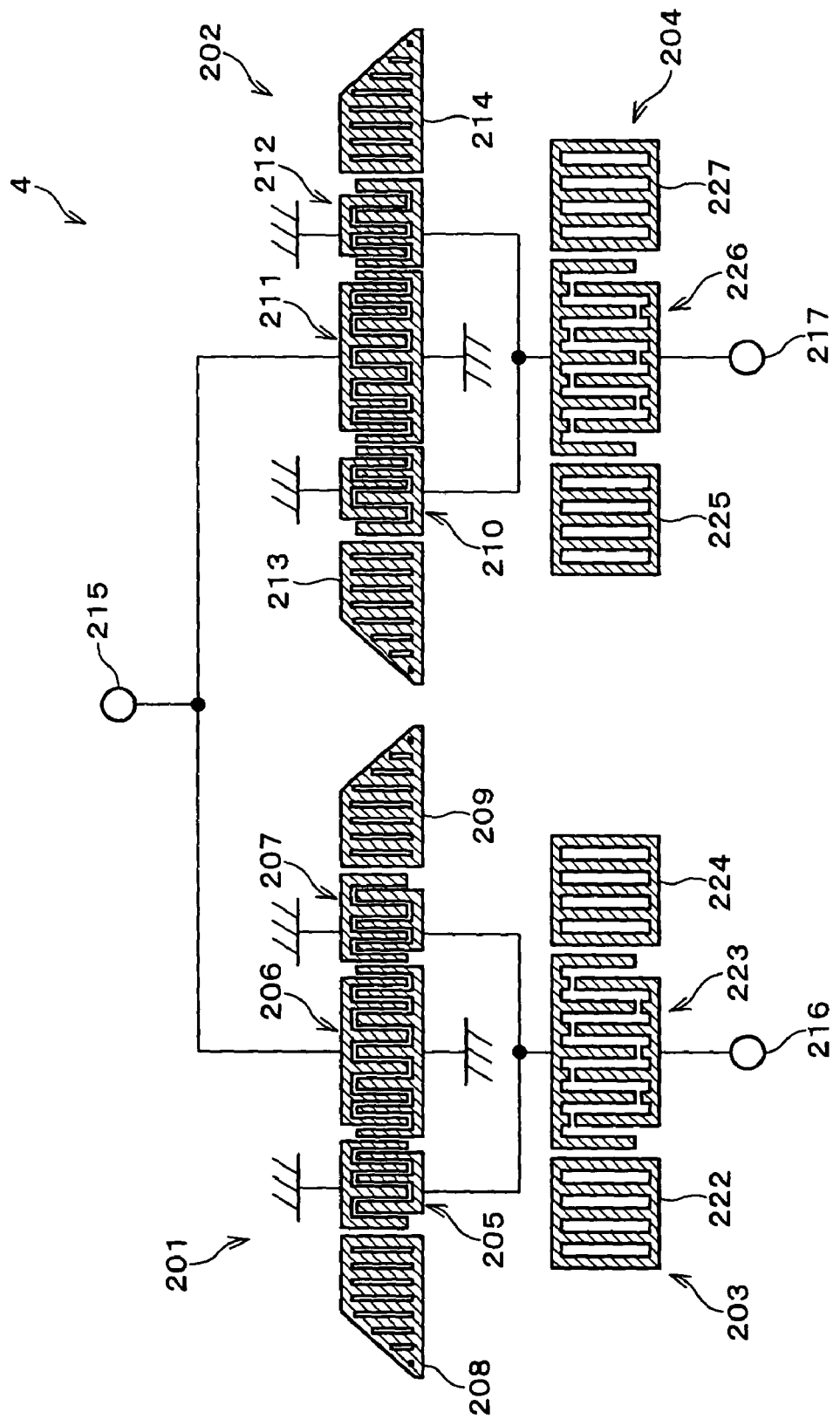
FIG. 12 is a schematic block diagram of another modification of the SAW device in FIG. 1.

As FIG. 12 shows, a SAW device 264 has a configuration in which, in the SAW device 200, the reflectors 208, 209, 213, and 214 are identical in structure and are weighted by apodization.

This can form a SAW device which can reduce the spurious component in the lower range of the passband and which has good attenuation characteristics in the vicinity of the passband outside the passband and a balanced-to-unbalanced conversion function. In particular, a SAW device which has a large attenuation in the lower range of the passband and a large common mode attenuation is obtained. Also, the reflectors 208 and 213, and the reflectors 209 and 219 may be identical in structure, and only the reflectors 208 and 213 may be weighted by apodization, or only the reflectors 209 and 214 may be weighted by apodization.

Figure 13:
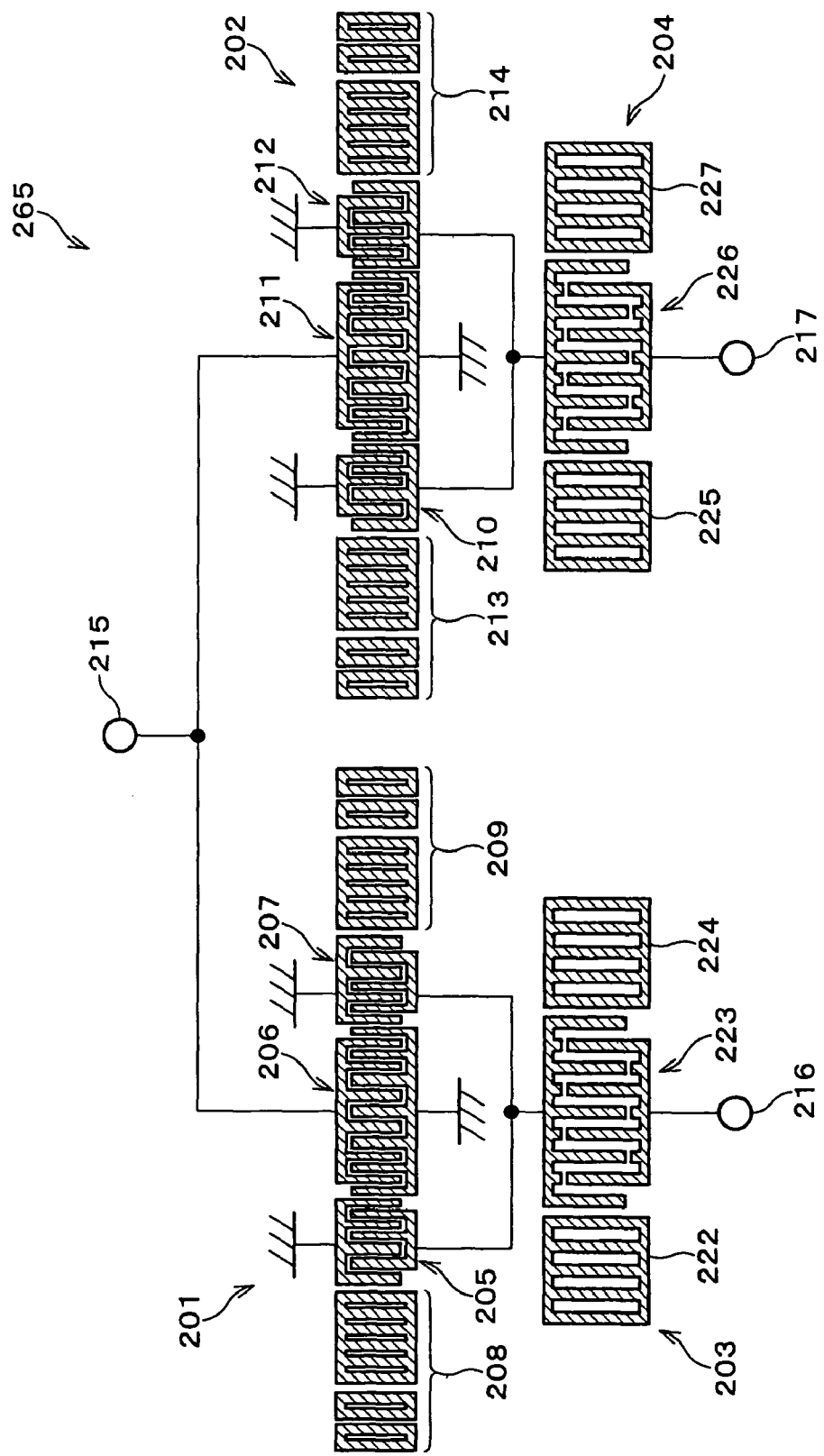
FIG. 13 is a schematic block diagram of still another modification of the SAW device in FIG. 1.

In addition, as FIG. 13 shows, a SAW device 265 has a configuration in which, in the SAW device 200, the reflectors 208, 209, 213, and 214 are identical in structure, and in at least one of them, at least one of an electrode finger and an electrode-finger gap differs.

This provides a SAW device which can reduce the spurious component in the lower range of the passband and which has good attenuation characteristics in the vicinity of the passband outside the passband and a balanced-to-unbalanced conversion function. In particular, a SAW device which has a large attenuation in the lower range of the passband and a large common mode attenuation is obtained. Also, the reflectors 208 and 213, and the reflectors 209 and 219 may be identical in structure, and in at least one of only the reflectors 208 and 213, at least one of an electrode finger and an electrode-finger gap may differ, or in at least one of the reflectors 209 and 214, at least one of an electrode finger and an electrode-finger gap may differ.

Figure 14:
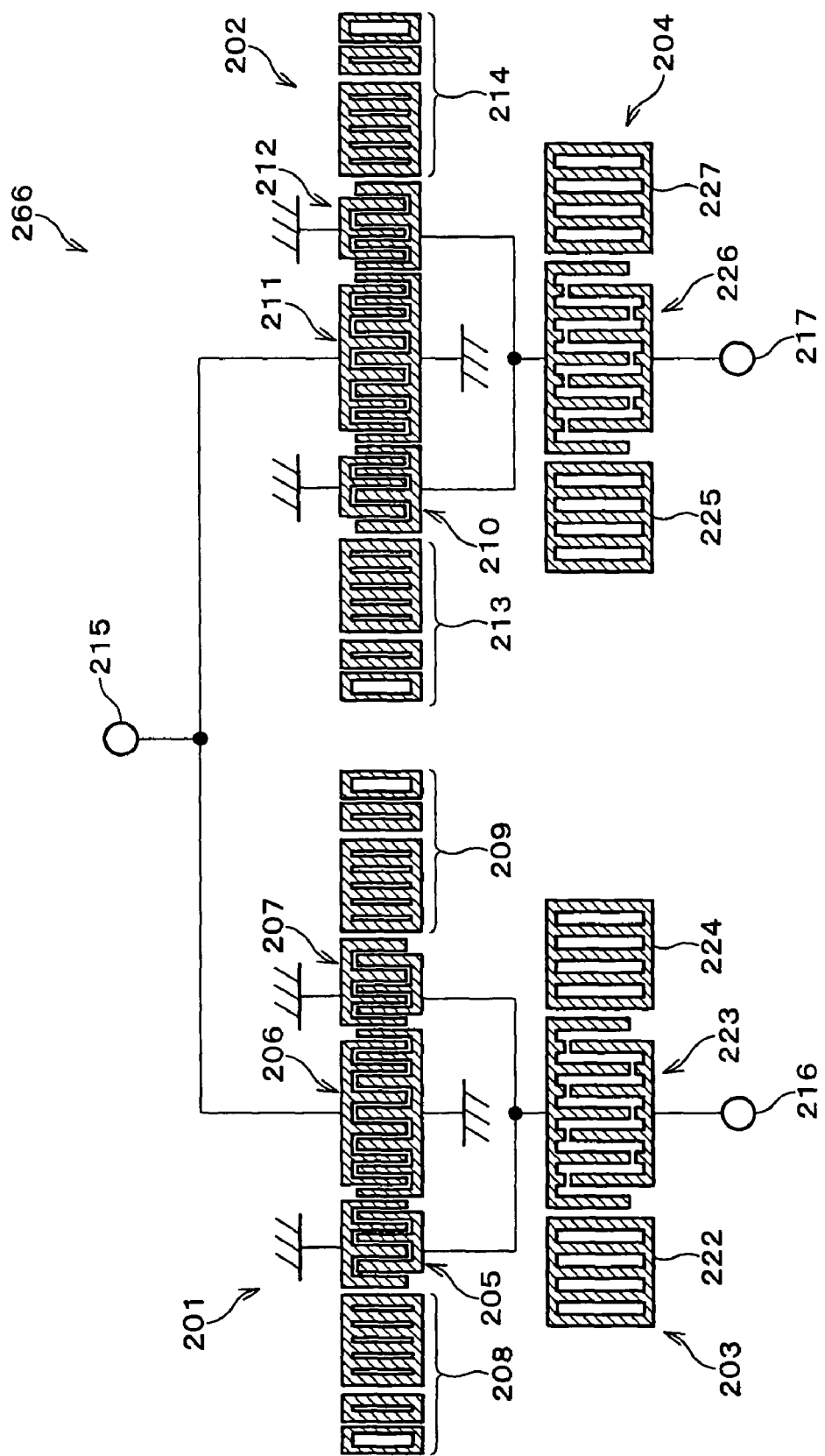
FIG. 14 is a schematic block diagram of still another modification of the SAW device in FIG. 1.

Also, as FIG. 14 shows, a SAW device 266 has a configuration in which, in the SAW device 200, the reflectors 208, 209, 213, and 214 are identical in structure, and one of them has a different electrode-finger duty. This can provide a SAW device which can reduce the spurious component in the lower range of the passband and which has good attenuation characteristics in the vicinity of the passband outside the passband and a balanced-to-unbalanced conversion function. In particular, a SAW device which has a large attenuation in the lower range of the passband and a large common mode attenuation is obtained. Also, the reflectors 208 and 213, and the reflectors 209 and 219 may be identical in structure, and at least one of only the reflectors 208 and 213 may have a different electrode-finger duty, or at least one of only the reflectors 209 and 214 may have a different electrode-finger duty.

Preferred Embodiment 3

Another preferred embodiment of the present invention is described below with reference to FIGS. 15 to 18.

Figure 15:
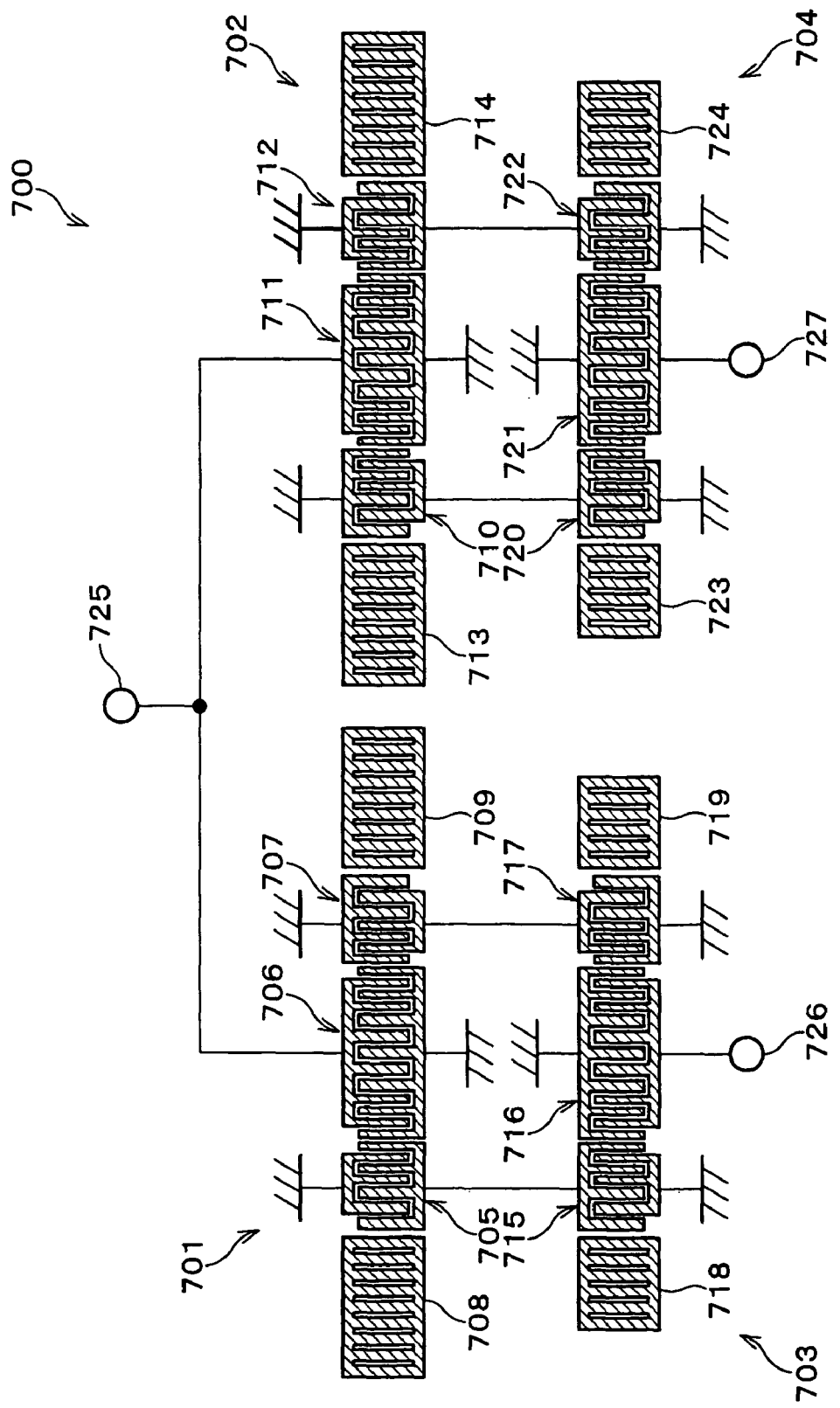
FIG. 15 is a schematic block diagram of a SAW device according to another preferred embodiment of the present invention.

FIG. 15 shows the configuration of a SAW device 700 according to the third preferred embodiment. The SAW device 700 according to the third preferred embodiment includes, on a piezoelectric substrate (not shown), two longitudinally-coupled-resonator SAW filters 701 and 702, and longitudinally-coupled-resonator SAW filters 703 and 704 which are cascade-connected to the longitudinally-coupled-resonator SAW filters 701 and 702.

The longitudinally-coupled-resonator SAW filters 701, 702, 703, and 704 preferably include aluminum electrodes. In the third preferred embodiment, a 40±5-degree Y-cut X-transmission LiTaO$_3$ substrate is preferably used as the piezoelectric substrate. The SAW device 700 has a balanced-to-unbalanced conversion function since the longitudinally-coupled-resonator SAW filters 701 and 702 are used.

In the longitudinally-coupled-resonator SAW filter 701, IDTs 705 and 706 are arranged with an IDT 706 provided therebetween, and reflectors 708 and 709 are arranged on the sides of both reflectors.

In the longitudinally-coupled-resonator SAW filter 702, IDTs 710 and 712 are arranged with an IDT 711 provided therebetween, and reflectors 713 and 714 are arranged on the sides of both IDTs. The directions of the IDTs 710 and 712 in the longitudinally-coupled-resonator SAW filter 702 have an inverse relationship in interdigital length compared with the IDTs 705 and 707 in the longitudinally-coupled-resonator SAW filter 701. Accordingly, the phase of an output signal to an input signal to the longitudinally-coupled-resonator SAW filter 702 is inverted approximately 180 degrees compared with the longitudinally-coupled-resonator SAW filter 701.

The reflectors 708, 709, 713, and 714 are all preferably identical in structure.

In the longitudinally-coupled-resonator SAW filter 703, IDTs 715 and 717 are arranged with an IDT 716 provided therebetween. On the sides of both IDTs, reflectors 718 and 719 are provided.

In the longitudinally-coupled-resonator SAW filter 704, IDTs 720 and 722 are arranged with an IDT 721 provided therebetween. On the sides of both IDTs, reflectors 723 and 724 are provided.

The longitudinally-coupled-resonator SAW filters 703 and 704 are all preferably identical in structure. In other words, the reflectors 718, 719, 723, and 724 are preferably all identical in structure.

In the third preferred embodiment, the IDT 706 in the longitudinally-coupled-resonator SAW filter 701 and the IDT 711 in the longitudinally-coupled-resonator SAW filter 702 are connected to an unbalanced signal terminal 725. The IDTs 705 and 707 in the longitudinally-coupled-resonator SAW filter 701 are connected to the IDTs 715 and 717 in the longitudinally-coupled-resonator SAW filter 703, respectively. Also, the IDTs 710 and 712 in the longitudinally-coupled-resonator SAW filter 702 are connected to IDTs 720 and 722 in the longitudinally-coupled-resonator SAW filter 704, respectively. The IDT 716 in the longitudinally-coupled-resonator SAW filter 703 is connected to an unbalanced signal terminal 726, and the IDT 721 in the longitudinally-coupled-resonator SAW filter 704 is connected to an unbalanced signal terminal 727.

In addition, the numbers of the reflectors 718 and 719 in the longitudinally-coupled-resonator SAW filter 703 differ from those of the reflectors 708 and 709 in the longitudinally-coupled-resonator SAW filter 701, and the numbers of the reflectors 723 and 724 in the longitudinally-coupled-resonator SAW filter 704 differ from those of the reflectors 713 and 714 in the longitudinally-coupled-resonator SAW filter 702. Also, the numbers of electrode fingers of the reflectors 708 and 709 in the longitudinally-coupled-resonator SAW filter 702 are equal to those of electrode fingers of the reflectors 713 and 714 in the longitudinally-coupled-resonator SAW filter 702. The numbers of electrode fingers of the reflectors 718 and 719 in the longitudinally-coupledresonator SAW filter 703 are equal to those of electrode fingers of the reflectors 723 and 724 in the longitudinally-coupled-resonator SAW filter 704.

As described above, in the SAW device 700 according to the third preferred embodiment, two longitudinally-coupled-resonator SAW filters 701 and 702, in each of which SAW resonators are connected in series, are used to differently shift the phases of the longitudinally-coupled-resonator SAW filters 701 and 702 by approximately 180 degrees, whereby a balanced-to-unbalanced conversion function can be provided.

Since the numbers of electrode fingers of the reflectors 718 and 719 in the longitudinally-coupled-resonator SAW filter 703 differ from those of the reflectors 708 and 709 in the longitudinally-coupled-resonator SAW filter 701, and the numbers of electrode fingers of the reflectors 723 and 724 in the longitudinally-coupled-resonator SAW filter 704 differ from those of the reflectors 713 and 714 in the longitudinally-coupled-resonator SAW filter 702, an attenuation in the lower range of the passband can be increased.

The numbers of electrode fingers of the reflectors 708 and 709 in the longitudinally-coupled-resonator SAW filter 701 are equal to those of electrode fingers of the reflectors 713 and 714 in the longitudinally-coupled-resonator SAW filter 702. The numbers of electrode fingers of the reflectors 718 and 719 in the longitudinally-coupled-resonator SAW filter 703 are equal to those of electrode fingers of the reflectors 723 and 724 in the longitudinally-coupled-resonator SAW filter 704. In other words, the reflectors 708 and 709 in the longitudinally-coupled-resonator SAW filter 701 are preferably substantially identical in structure to the reflectors 713 and 714 in the longitudinally-coupled-resonator SAW filter 702. The reflectors 718 and 719 in the longitudinally-coupled-resonator SAW filter 703 are preferably substantially identical in structure to the reflectors 723 and 724 in the longitudinally-coupled-resonator SAW filter 704. This can increase a common mode attenuation in the lower range of the passband.

In other words, based on these points, a SAW device which has good attenuation characteristics in the vicinity of the passband outside the passband and a balanced-to-unbalanced conversion function is obtained. In particular, a SAW device which has a large attenuation in the lower range of the passband and a large common mode attenuation is obtained.

Modifications of the SAW device 700 are described below. In the following modifications, in the longitudinally-coupled-resonator SAW filters 701, 702, 703, and 704, all the reflectors 708, 709, 713, 714, 718, 719, 723, and 724 preferably have the same number of electrode fingers.

Figure 16:
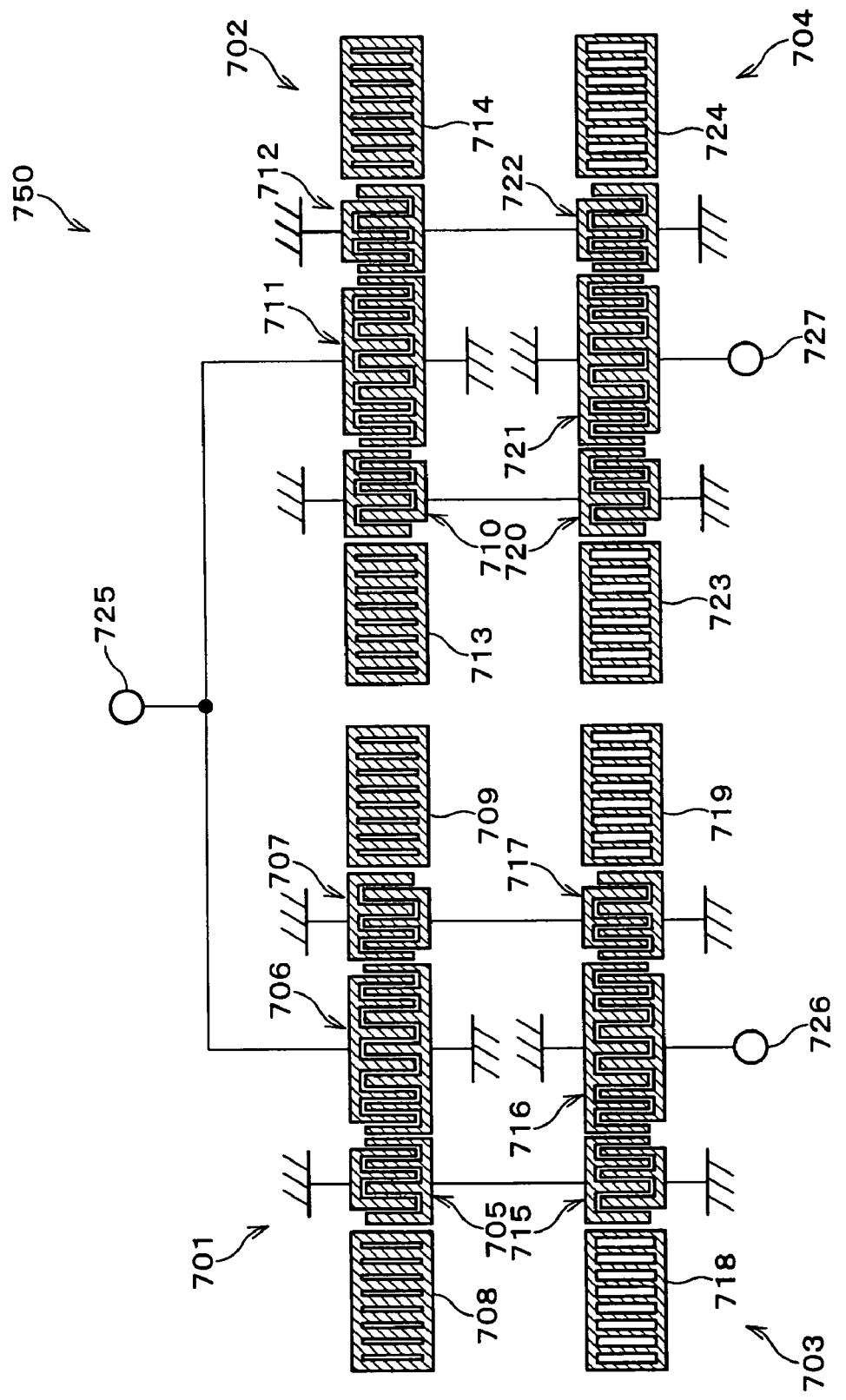
FIG. 16 is a schematic block diagram of a modification of the SAW device in FIG. 15.

By way of example, as FIG. 16 shows, a SAW device 750 according to modification 5 has a configuration in which, in the SAW device 700, the duties of the reflectors 718 and 719 in the longitudinally-coupled-resonator SAW filter 703 differ from those of the reflectors 708 and 709 in the longitudinally-coupled-resonator SAW filter 701, and the duties of the reflectors 723 and 724 in the longitudinally-coupled-resonator SAW filter 704 differ from those of the reflectors 713 and 714 in the longitudinally-coupled-resonator SAW filter 702.

Also, in the configuration of the SAW device 750, in the SAW device 700, the duties of the reflectors 713 and 714 in the longitudinally-coupled-resonator SAW filter 702 are substantially equal to those of the reflectors 708 and 709 in the longitudinally-coupled-resonator SAW filter 701, and the reflectors 723 and 724 in the longitudinally-coupled-resonator SAW filter 704 are substantially equal to those of reflectors 718 and 719 in the longitudinally-coupled-resonator SAW filter 703.

Based on these points, a SAW device which has good attenuation characteristics in the vicinity of the passband outside the passband and a balanced-to-unbalanced conversion function is obtained. In particular, a SAW device which has a large attenuation in the lower range of the passband and a large common mode attenuation is obtained.

Figure 17:
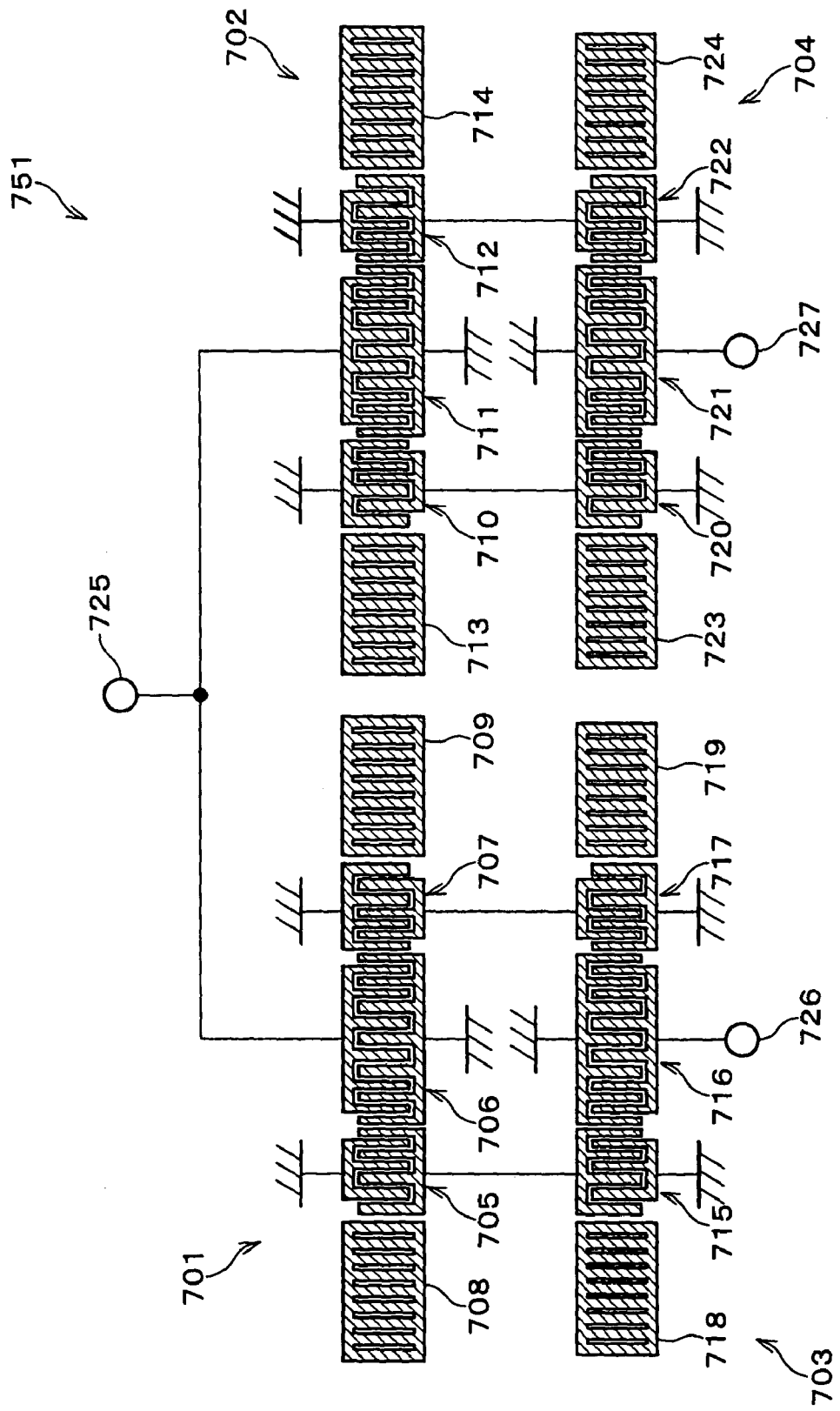
FIG. 17 is a schematic block diagram of another modification of the SAW device in FIG. 15.

As FIG. 17 shows, a SAW device 751 according to modification 6 has a configuration in which, in the SAW device 700, the electrode-finger pitches of the reflectors 718 and 719 differ from those of the reflectors 708 and 709 in the longitudinally-coupled-resonator SAW filter 701, and the electrode-finger pitches of the reflectors 723 and 724 in the longitudinally-coupled-resonator SAW filter 704 differ from those of the reflectors 713 and 714 in the longitudinally-coupled-resonator SAW filter 702.

Also, in the configuration of the SAW device 751, in the SAW device 700, the electrode-finger pitches of the reflectors 713 and 714 in the longitudinally-coupled-resonator SAW filter 702 are substantially equal to those of the reflectors 708 and 709 in the longitudinally-coupled-resonator SAW filter 701, and the electrode-finger pitches of the reflectors 723 and 724 in the longitudinally-coupled-resonator SAW filter 704 are substantially equal to those of the reflectors 718 and 719 in the longitudinally-coupled-resonator SAW filter 703.

Based on these points, a SAW device which has good attenuation characteristics in the vicinity of the passband outside the passband and which has a balanced-to-unbalanced conversion function is obtained. In particular, a SAW device which has a large attenuation in the lower range of the passband and a large common mode attenuation is obtained.

Figure 18:
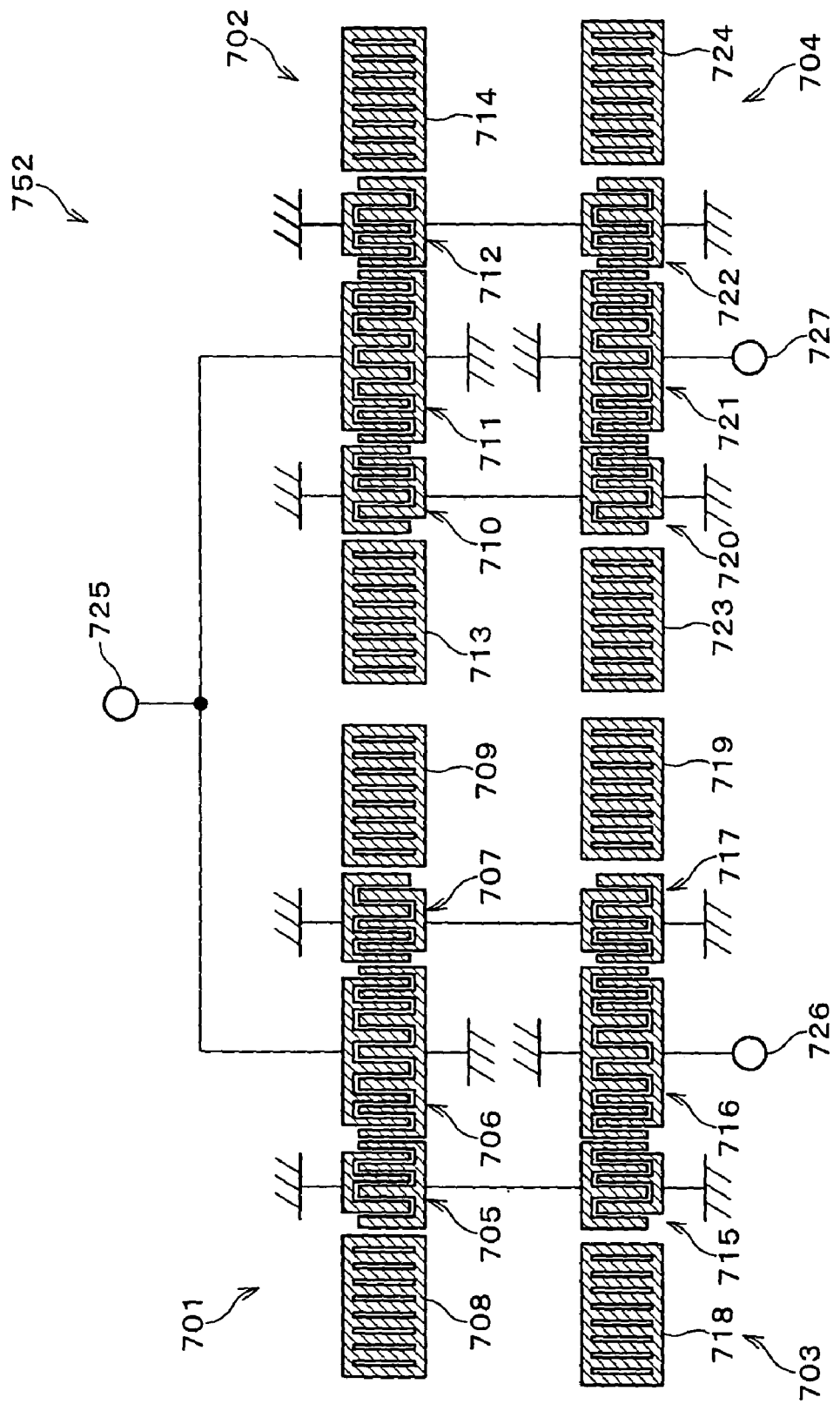
FIG. 18 is a schematic block diagram of a further modification of the SAW device in FIG. 15.
Figure 19:
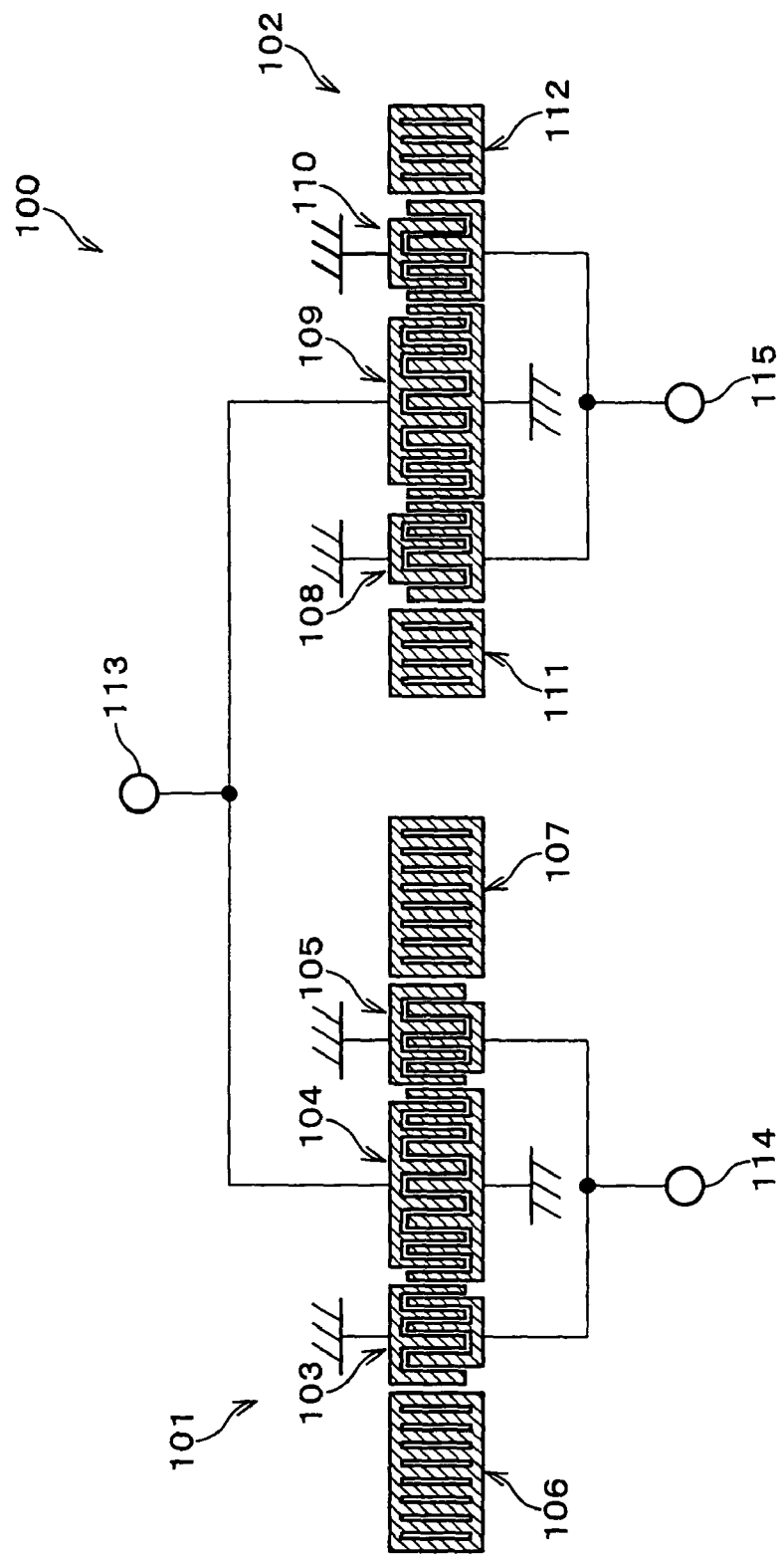
FIG. 19 is a schematic block diagram of a SAW device of the related art.
Figure 20:
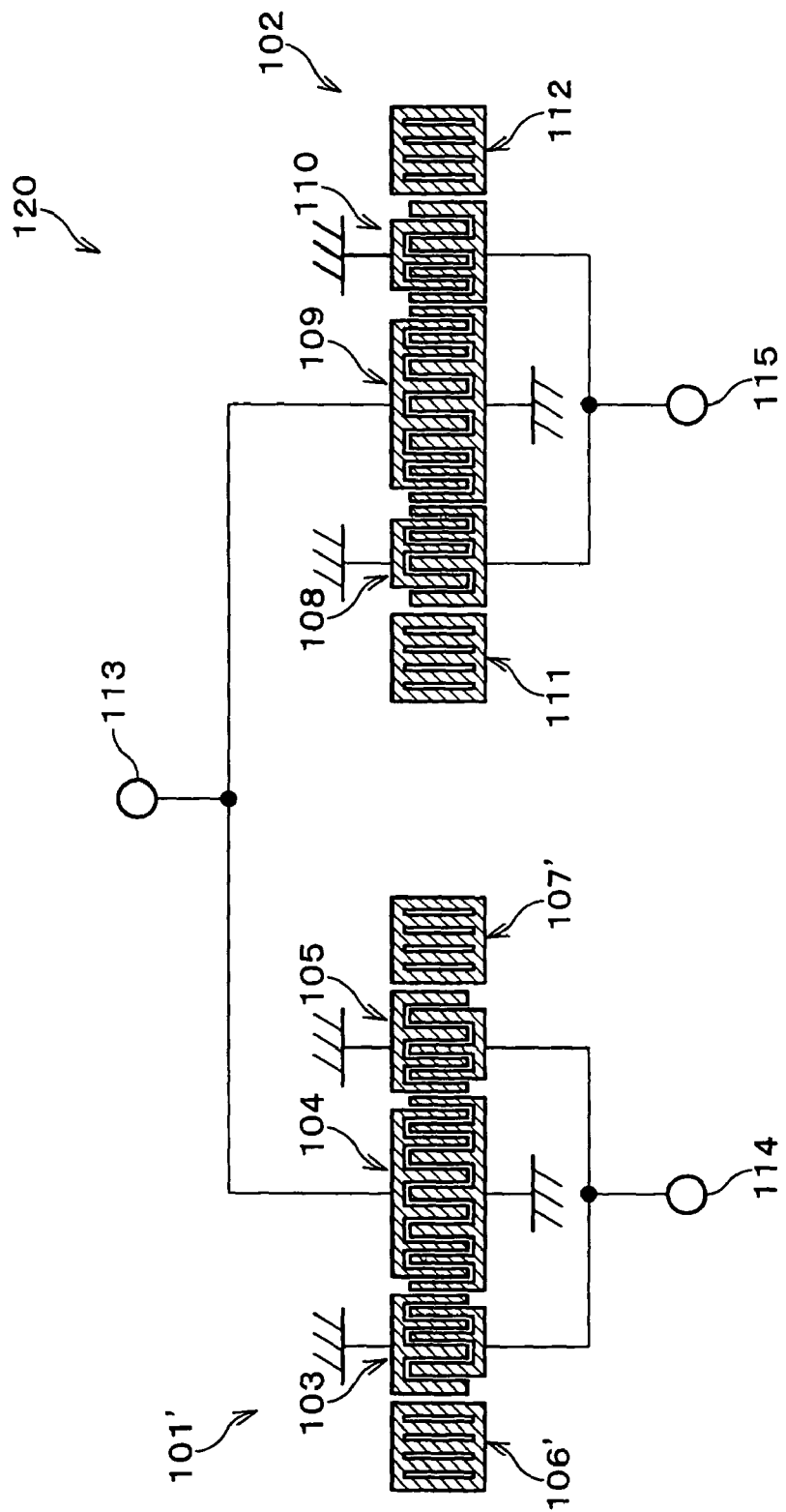
FIG. 20 is a schematic block diagram of a SAW device according to comparative example 1.
Figure 21:
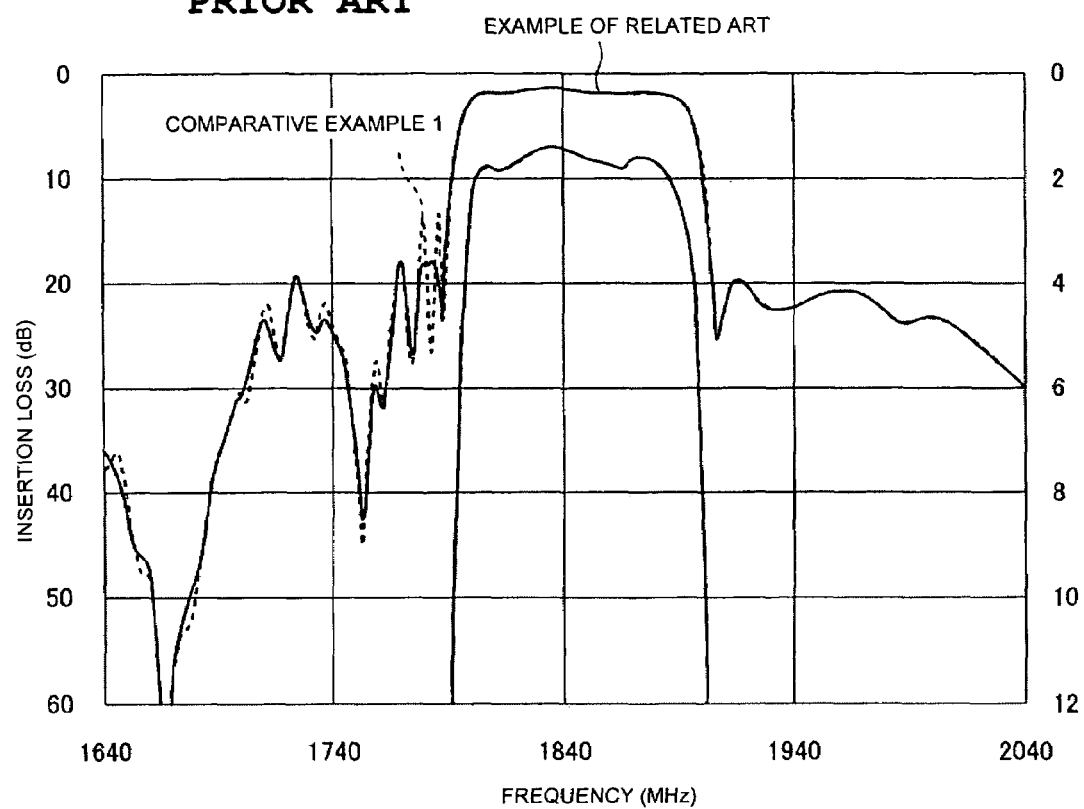
FIG. 21 is a graph showing acoustic-frequency-to-insertion-loss characteristics of the SAW device of the related art and the SAW device (comparative example 1)
Figure 22:
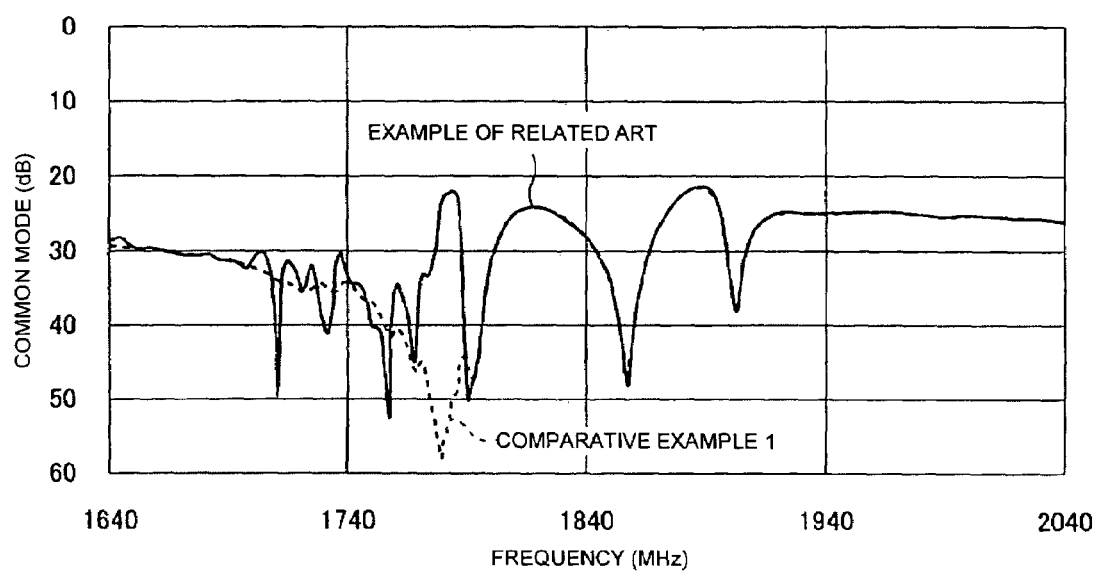
FIG. 22 is a graph showing frequency-to-common-mode-attenuation characteristics of the SAW device of the related art and the SAW device (comparative example 1)

As FIG. 18 shows, a SAW device 752 according to modification 7 has a configuration in which, in the SAW device 700, the center-to-center distance of the adjacent electrode fingers between each of the reflectors 708 and 709 in the longitudinally-coupled-resonator SAW filter 701 and each of the IDTs 705 and 707 adjacent thereto differs from that between each of the reflectors 718 and 719 in the longitudinally-coupled-resonator SAW filter 703 and each of the IDTs 715 and 717 adjacent thereto, and the center-to-center distance of the adjacent electrode fingers between each of the reflectors 713 and 714 and each of the IDTs 710 and 712 adjacent thereto differs from that between each of the reflectors 723 and 724 and each of the IDTs 720 and 722 adjacent thereto.

In the configuration of the SAW device 752, in the SAW device 700, the center-to-center distance of the adjacent electrode fingers between each of the reflectors 708 and 709 in the longitudinally-coupled-resonator SAW filter 701 and each of the IDTs 705 and 707 adjacent thereto is substantially equal to that between each of the reflectors 713 and 714 in the longitudinally-coupled-resonator SAW filter 702 and each of the IDTs 710 and 712 adjacent thereto, and the center-to-center distance of the adjacent electrode fingers between each of the reflectors 718 and 719 in the longitudinally-coupled-resonator SAW filter 703 and each of the IDTs 715 and 717 adjacent thereto is substantially equal to that between each of the reflectors 723 and 724 in the longitudinally-coupled-resonator SAW filter 704 and each of the IDTs 720 and 722 adjacent thereto.

Based on these points, a SAW device which has good attenuation characteristics in the vicinity of the passband outside the passband and a balanced-to-unbalanced conversion function is obtained. In particular, a SAW device which has a large attenuation in the lower range of the passband and a large common mode attenuation is obtained.

In addition, in each of the SAW devices 700, 750, 751, and 752, the longitudinally-coupled-resonator SAW filter 703 differs in structure from the longitudinally-coupled-resonator SAW filter 701, and the longitudinally-coupled-resonator SAW filter 704 differs in structure from the longitudinally-coupled-resonator SAW filter 702. However, the configuration of each SAW device is not limited thereto. The longitudinally-coupled-resonator SAW filter 704 may differ in structure from the longitudinally-coupled-resonator SAW filter 701, and the longitudinally-coupled-resonator SAW filter 703 may differ in structure from the longitudinally-coupled-resonator SAW filter 702.

Each of the SAW devices 700, 750, 751 and 752 may be accommodated in a package, as in the above-described preferred embodiment 1.

In the foregoing, the 40±5-degree Y-cut X-transmission $LiTaO_3$ substrate is preferably used. However, as can be understood from the principle by which the advantages can be obtained, in the present invention, by using not only the above-described substrate, but also substrates such as a 64–72-degree Y-cut X-transmission $LiNbO_3$ substrate, and a 41-degree Y-cut X-transmission $LiNbO_3$ substrate, similar advantages can be obtained.

Next, a communication apparatus 600 using a SAW device according to any of the preferred embodiments described above is described with reference to FIG. 23. The communication apparatus 600 includes, on a receiving side (Rx side), an antenna 601, an antenna sharing unit/radio frequency (RF) top filter 602, an amplifier 603, an Rx interstage filter 604, a mixer 605, a 1st IF filter 606, a mixer 607, a 2nd IF filter 608, a 1st+2nd local synthesizer 611, a temperature compensated crystal oscillator (TCXO) 612, a divider 613, and a local filter 614.

Figure 23:
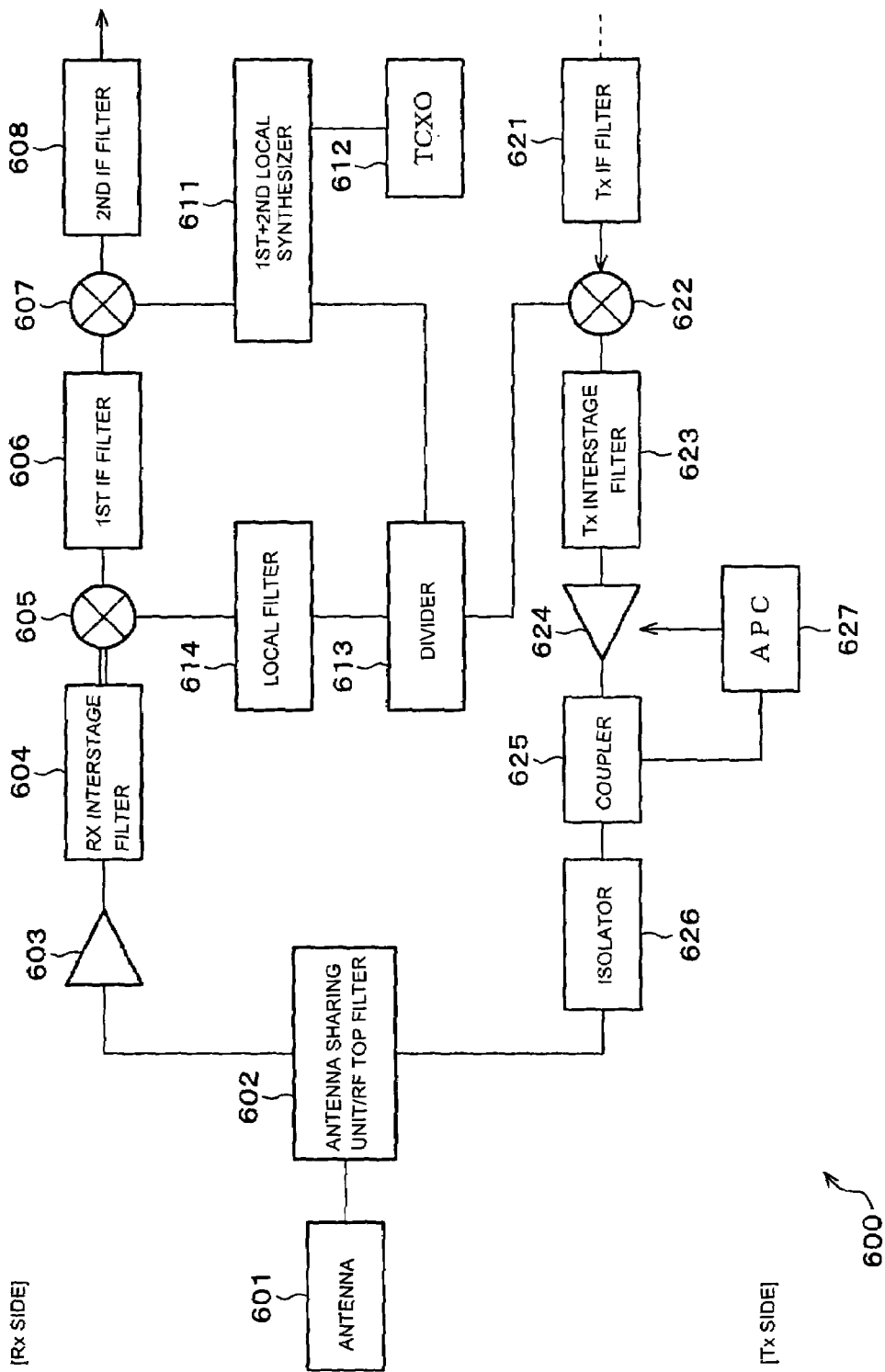
FIG. 23 is a block diagram of main portions of a communication apparatus in which a SAW device according to each of the preferred embodiments of the present invention may be used.
Figure 24:
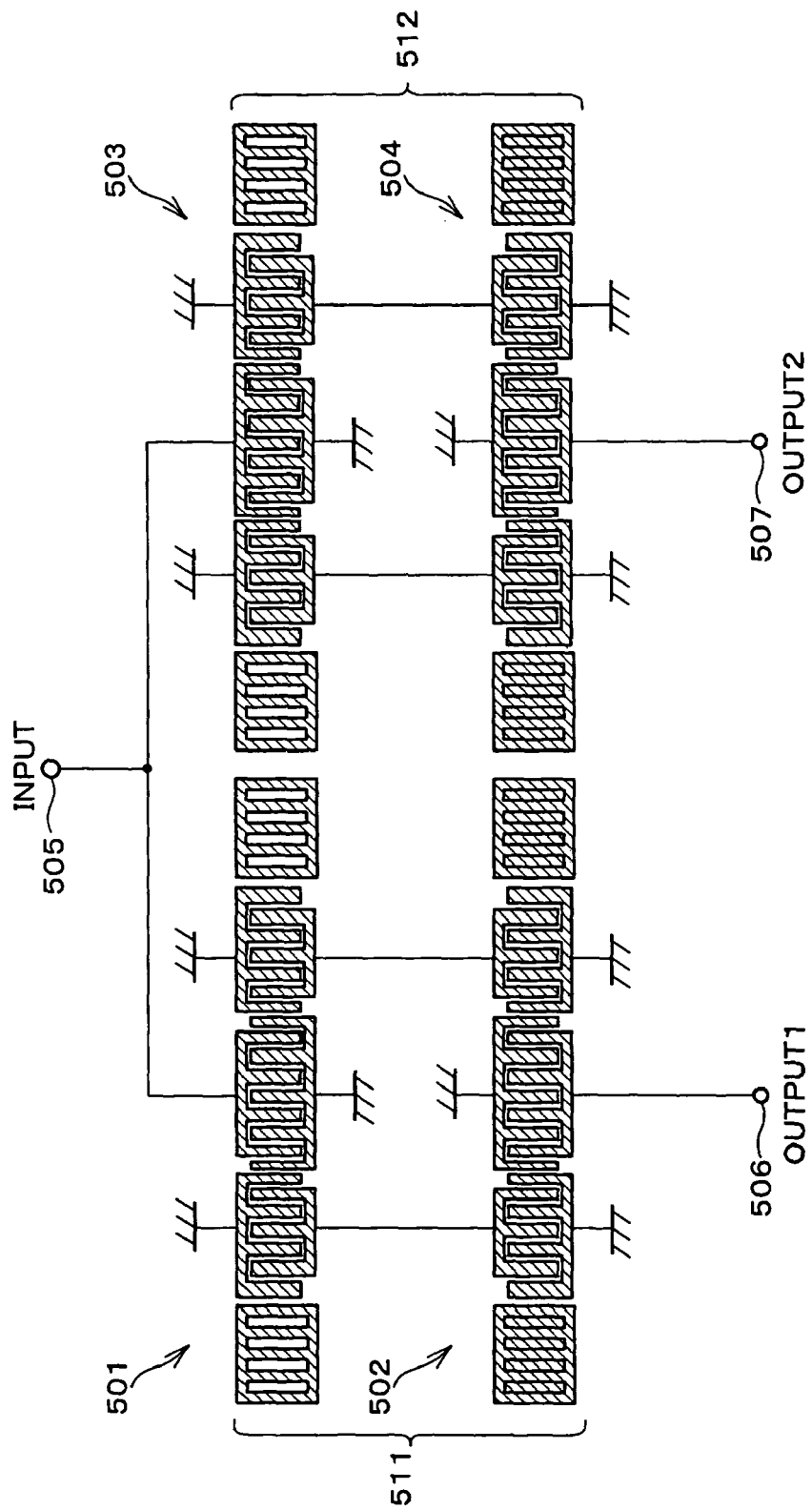
FIG. 24 is a schematic block diagram of a conventional SAW device.

From the Rx interstage filter 604 to the mixer 605, it is preferable to perform transmission by using balanced signals in order to ensure balance, as indicated by the two lines in FIG. 23.

Also, on a transmitting side (Tx side), the communication apparatus 600 shares the antenna 601 and the antenna sharing unit/RF top filter 602, and includes a Tx intermediate frequency (IF) filter 621, a mixer 622, a Tx interstage filter 623, an amplifier 624, a coupler 625, an isolator 626, and an automatic power controller (APC) 627.

SAW devices as described in each of the above preferred embodiments can be suitably used in the Rx interstage filter 604, the 1st IF filter 606, the Tx interstage filter 623, and the antenna sharing unit/RF top filter 602.

A SAW device of preferred embodiments of the present invention can have a balanced-to-unbalanced conversion function together with a filtering function, and also has superior characteristics in that it has good attenuation characteristics in the vicinity of the passband outside the passband, and particularly, a large attenuation in the lower range of the passband and a large common mode attenuation. Therefore, a communication apparatus of another preferred embodiment of the present invention can improve transmission characteristics.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A surface acoustic wave device comprising:
a piezoelectric substrate; and
first and second surface-acoustic-wave filter elements arranged on said piezoelectric substrate so as to have a balanced-to-unbalanced conversion function, said first and second surface-acoustic-wave filter elements each including at least two interdigital transducers arranged along a propagation direction of surface acoustic waves, and a first reflector and a second reflector which are arranged so that said at least two interdigital transducers are provided along the propagation direction between the first and second reflectors; wherein
the first and second reflectors are weighted by apodization; and
in said first and second surface-acoustic-wave filter elements, the first reflectors have the same structure, and the second reflectors have the same structure.

2. A communication apparatus including a surface acoustic wave device as described in claim 1.

* * * * *